United States Patent
Dosaka et al.

(10) Patent No.: US 8,169,807 B2
(45) Date of Patent: May 1, 2012

(54) CONTENT ADDRESSABLE MEMORY DEVICE HAVING MATCH LINE EQUALIZER CIRCUIT

(75) Inventors: Katsumi Dosaka, Tokyo (JP); Kazutami Arimoto, Tokyo (JP); Yoshio Matsuda, Ishikawa (JP)

(73) Assignee: Renesas Electronics Corporation, Kanagawa (JP)

( * ) Notice: Subject to any disclaimer, the term of this patent is extended or adjusted under 35 U.S.C. 154(b) by 853 days.

(21) Appl. No.: 12/261,598

(22) Filed: Oct. 30, 2008

(65) Prior Publication Data
US 2009/0113122 A1 Apr. 30, 2009

(30) Foreign Application Priority Data
Oct. 31, 2007 (JP) ................. 2007-283462

(51) Int. Cl.
*G11C 15/00* (2006.01)
(52) U.S. Cl. ............ 365/49; 365/189.07; 365/204

(58) Field of Classification Search .......... 365/49, 365/189.07, 204
See application file for complete search history.

(56) References Cited

U.S. PATENT DOCUMENTS

| 6,535,410 | B2 | 3/2003 | Yanagawa |
| 6,704,216 | B1 * | 3/2004 | Cheng et al. ......... 365/49.17 |
| 6,795,325 | B1 | 9/2004 | Inoue |
| 2006/0233011 | A1 | 10/2006 | Matsuoka et al. |

FOREIGN PATENT DOCUMENTS

| JP | 2002-358791 | 12/2002 |
| JP | 2004-295986 | 10/2004 |
| JP | 2006-309917 | 11/2006 |

* cited by examiner

*Primary Examiner* — Jason Lappas
(74) *Attorney, Agent, or Firm* — McDermott Will & Emery LLP

(57) ABSTRACT

In a content addressable memory device, before search operations in two TCAM cells connected to first and second match lines, respectively, a memory controller connects the first match line to a power source and connects the second match line to a ground, and then connects the first and second match lines to each other so as that electric potentials of the first and second match lines are the same as each other.

8 Claims, 14 Drawing Sheets

Fig. 7  THIRD PREFERRED EMBODIMENT

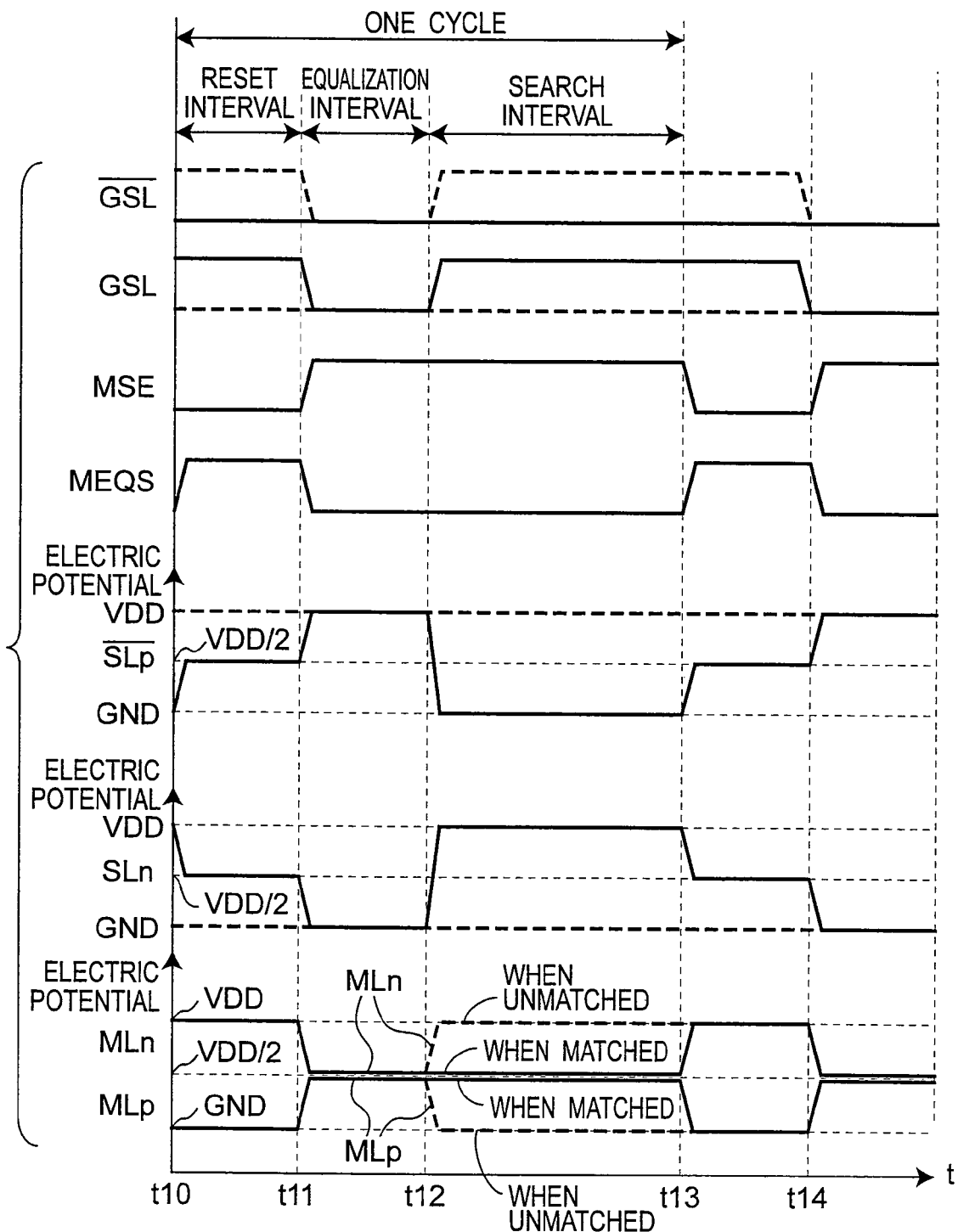

FIFTH PREFERRED EMBODIMENT

SIXTH PREFERRED EMBODIMENT

CONTENT ADDRESSABLE MEMORY DEVICE HAVING MATCH LINE EQUALIZER CIRCUIT

BACKGROUND OF THE INVENTION

1. Field of the Invention

The present invention relates to a content addressable memory (referred to as a CAM hereinafter) device having CAM cells, and in particular, to a CAM device having a match line equalizer circuit.

2. Description of the Related Art

Recently, a CAM device having CAM cells or ternary CAM (referred to as a TCAM hereinafter) cells (these CAM cells are generally referred to as CAM cells hereinafter) has been employed in a retrieval unit for network address paths or the like. Each CAM cell is constructed by including one storage cell for storing binary storage data of "0" and "1", a search line for searching two search data of "0" and "1", a match line, and a comparator circuit. In this case, the comparator circuit compares the search data from the search line with the storage data of the storage cell, and outputs a signal indicating a result of the comparison to the match line. In addition, each TCAM cell is constructed by including two storage cells for storing three-value storage data of "0", "1", and "X (Don't care; indefinite value), a pair of search lines for searching two search data of "0" and "1", a match line, and a comparator circuit. The comparator circuit compares the search data from the pair of search lines with the storage data of the storage cells, and outputs a signal indicating a result of the comparison to the match line. In this case, the match line is precharged to a high level in advance, and discharged in response to a signal outputted from the comparator circuit indicating that the search data is unmatched with the storage data. This search operation is a parallel operation that can be simultaneously executed on all entries of search targets in a CAM array constituted by a plurality of CAM cells or TCAM cells. Therefore, it is possible to perform the data search at high speed in the CAM device.

However, the following problems have become obvious for the CAM device constructed by including CAM cells. For an interval of the above-stated search operation, relatively large peak current flows when charging and discharging the match line and charging and discharge of the search line. In addition, an increase in a capacity of the CAM array leads to an increased peak current and relatively large voltage drop, and the increased peak current causes an electromagnetic interference and a power-supply noise. Further, the increase in the capacity of the CAM array also leads to an increased total current consumption of the CAM device. As measures against these problems, it is necessary to thicken the power source wirings in order to reduce the impedances of the power source and ground lines, increase the number of the power source pads, reduce the impedance of the package, and intensify the power source of the circuit board on which a CAM LSI is mounted. It is also necessary to take such measures as arrangement of a radiation fin in order to handle an increased amount of heat following the increased current. However, each of these measures disadvantageously leads to increased costs of an LSI for the CAM, and operation margin such as the operation of the power source at the lower limit and the operating frequency deteriorates. These problems are major problem making it difficult to increase the capacity of the CAM array.

In a CAM device according to a prior art disclosed in the Japanese patent laid-open publication No. JP-2006-309917-A, a ternary memory, a match comparator circuit, and a search line activation control circuit are provided for each of the divided sub arrays. First of all, an arbitrary sub array is selected by match comparison of a second search request for arbitrarily designating a plurality of divided sub arrays with a value stored in the ternary memory. The match comparator circuit provided in the selected sub array transmits a series data obtained by a first search request to the search line activation control circuit. Therefore, it is possible to realize low power consumption by adding a simple hardware.

The Japanese patent laid-open publication No. JP-2004-295986-A discloses a semiconductor memory device according to a prior art constructed by including (a) a CAM cell block to which storage data expressing a combination of digital values stored in four memory cells, respectively, by a two-bit digital value, (b) a search line to which a digital value is set to that is to be match-compared with the digital value stored in each of the memory cells, (c) a search data setting unit for setting a one-bit digital value to the search line connected to each of the memory cells and setting search data expressing a combination of four-bit digital values by a two-bit digital value, (d) a transistor determining whether the storage data is matched or unmatched with the search data, and (e) a match line for outputting a result indicating this determination. Since the frequency of activation of the search line is reduced in the search operation, the power consumption can be reduced.

The Japanese patent laid-open publication No. JP-2002-358791-A discloses a CAM device according to a prior art configured as follows. The CAM device includes (a) a first match line that is a first part obtained by dividing one match line corresponding to one entry data into two parts and whose electric potential changes from a first electric potential to a second electric potential in the case of an unmatched condition, (b) a second match line that is a second part obtained by dividing the above match line and whose electric potential changes from the second electric potential to the first electric potential in the case of the unmatched condition, (c) a first precharge circuit for precharging the first match line to the first electric potential, (d) a second precharge circuit for precharging the second match line to the second electric potential, and (e) a short circuit short-circuiting the first and second match lines to each other before the precharge operations by the first and second precharge circuit when both of the first and second match lines are in the unmatched condition. By precharging or discharging each of the match lines after the short-circuiting, the power consumption can be reduced.

However, the CAM devices or semiconductor memory devices according to the prior art have such a problem that the power consumption and the peak current cannot be further reduced.

SUMMARY OF THE INVENTION

It is an object of the present invention to provide a content addressable memory device capable of solving the above-stated problems and capable of reducing the power consumption and the peak current as compared with those of the prior art.

According to an aspect of the invention, there is provided a content addressable memory device including a first memory cell and a second memory cell. The content addressable memory device is characterized by further including a match line equalizer circuit and a controller. In this case, the first memory cell is connected to a first match line and a first search line, and has a first storage element and a first comparator circuit. The first storage element stores first data, and the first comparator circuit compares first search data inputted via the first search line with the first data, generates a first signal indicating a result of the comparison, and outputs the first signal to the first match line. The second memory cell is connected to a second match line and a second search line, and has a second storage element and a second comparator circuit. The second storage element stores second data, and the second comparator circuit compares second search data inputted via the second search line with the second data, generates a second signal indicating a result of the comparison, and outputs the second signal to the second match line. The match line equalizer circuit has a first switch connected between the first match line and a power source, a second switch connected between the second match line and a ground, and a third switch connected between the first and second match lines. Before the comparisons by the first and second comparator circuits, the controller controls the first and second switches to be turned on and the third switch to be turned off, and then controls the first and second switches to be turned off and the third switch to be turned on, so that electric potentials of the first and second match lines are the same as each other.

According to the content addressable memory device of the present invention, for example, the first match line is a match line MLp, and the second match line is a match line MLn. The match line MLp is connected to a power source having a power source electric potential VDD and the match line MLn is grounded, and then the match line MLp is connected to the match line MLn so that electric potentials of the match lines MLp and MLn are the same as each other and each of the electric potentials has an electric potential of VDD/2. Accordingly, the present invention has such an advantageous effect that the power consumption and the peak current can be reduced to a quarter of those of the prior art, respectively.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 12 is a timing chart showing an example of operation performed by the TCAM device of FIG. 10;

DETAILED DESCRIPTION OF THE PREFERRED EMBODIMENTS

Figure 1:
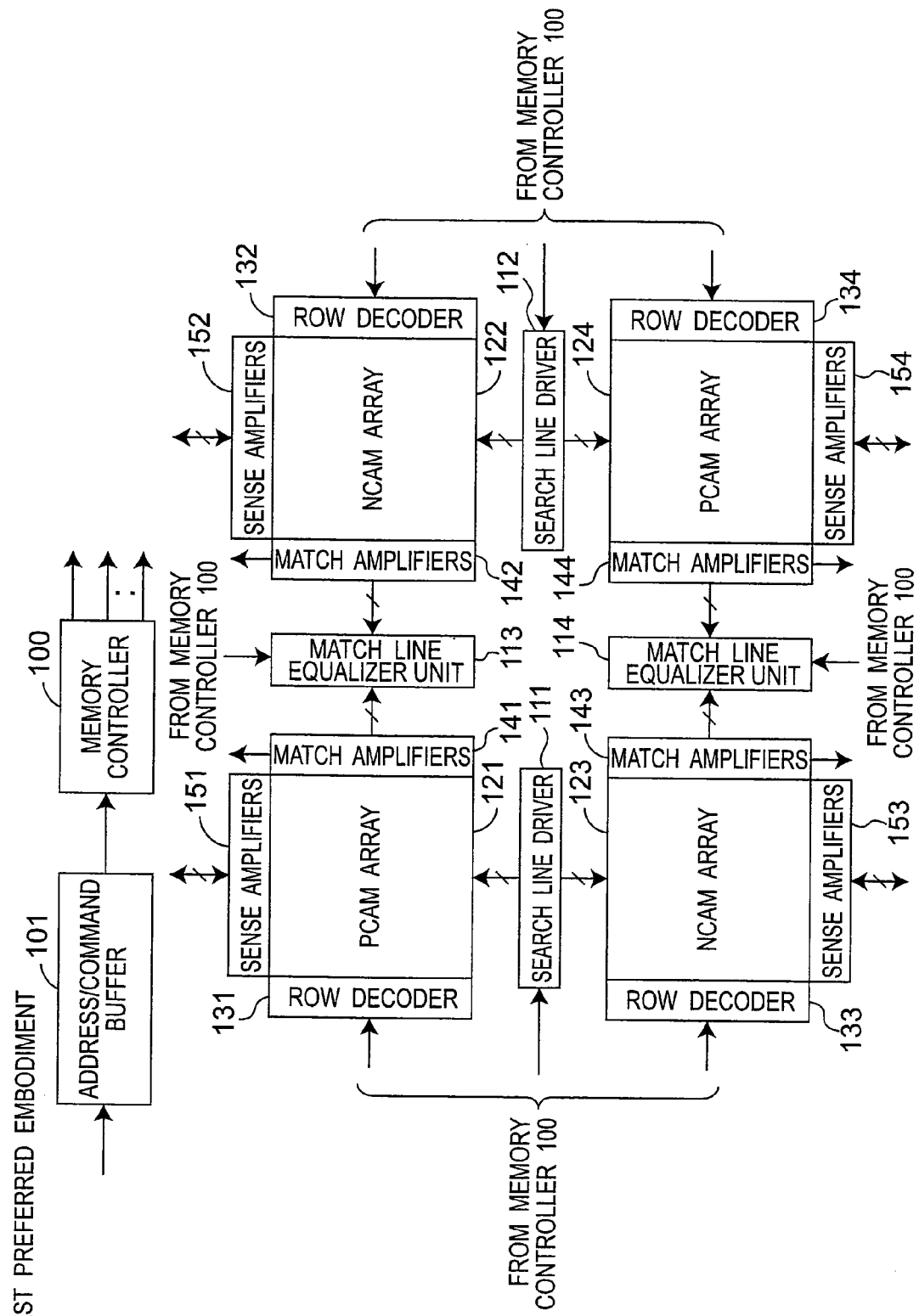
FIG. 1 is a block diagram showing a configuration of a TCAM device of a content addressable memory device according to a first preferred embodiment of the present invention.

Preferred embodiments according to the present invention will be described below with reference to the attached drawings. In the following preferred embodiments, components similar to each other are denoted by the same reference numerals.

First Preferred Embodiment

Figure 2:
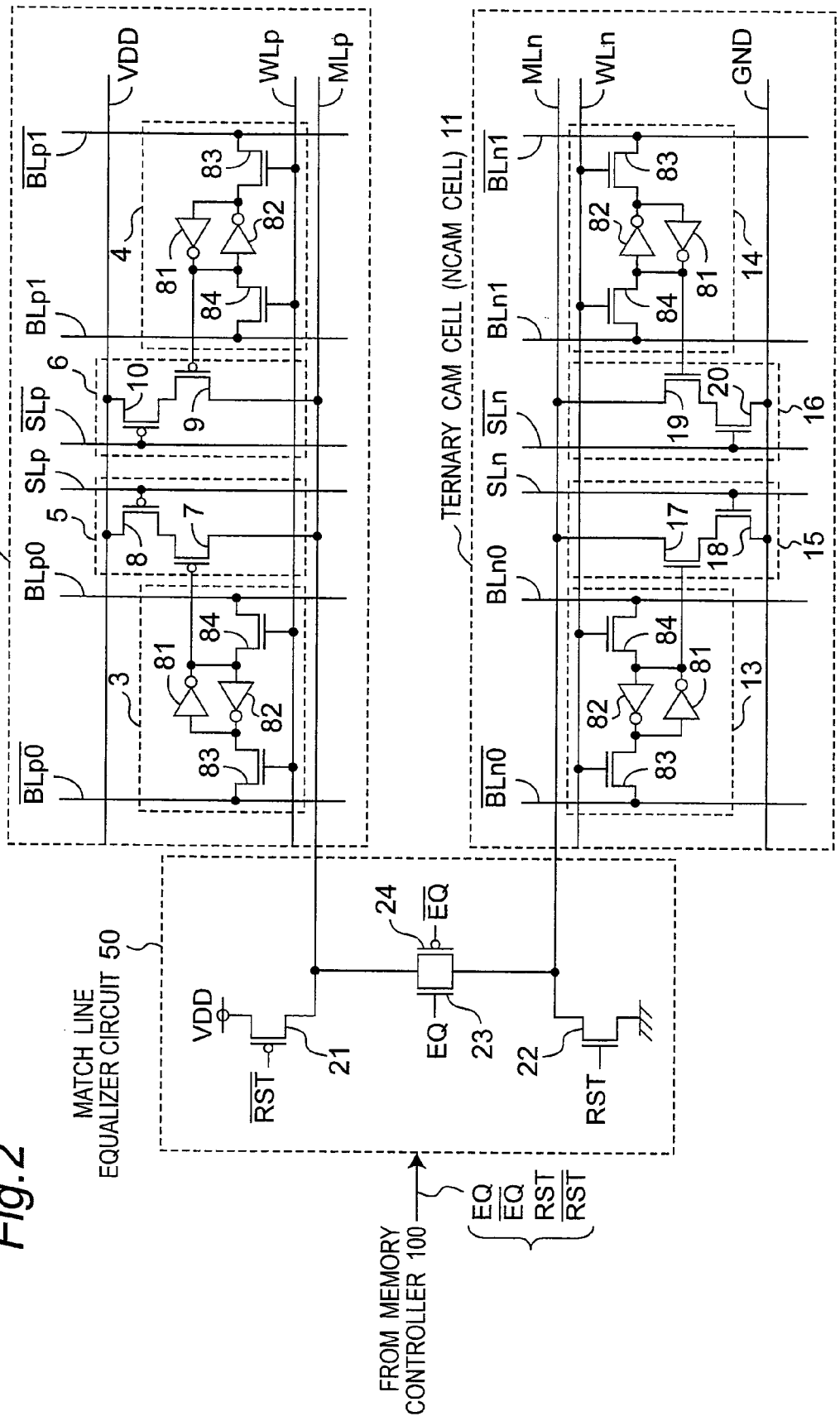
FIG. 2 is a circuit diagram showing configurations of a PCAM cell 1 that is one of PCAM cells 1 constituting a PCAM array 121 of FIG. 1, a match line equalizer circuit 50 that is one of match line equalizer circuit 50 constituting a match line equalizer unit 113 of FIG. 1, and an NCAM cell 11 that is one of NCAM cells 1 constituting an NCAM array 122 of FIG. 1.

FIG. 1 is a block diagram showing a configuration of a TCAM device of a content addressable memory device according to a first preferred embodiment of the present invention. In addition, FIG. 2 is a circuit diagram showing configurations of a PCAM cell 1 that is one of PCAM cells 1 constituting a PCAM array 121 of FIG. 1, a match line equalizer circuit 50 that is one of match line equalizer circuit 50 constituting a match line equalizer unit 113 of FIG. 1, and an NCAM cell 11 that is one of NCAM cells 1 constituting an NCAM array 122 of FIG. 1. Referring to FIG. 1, the TCAM device according to the first preferred embodiment is constructed by including an address/command buffer 101, a memory controller 100, PCAM arrays 112 and 124, NCAM arrays 122 and 123, row decoders 131 to 134, sense amplifiers 151 to 154, search line drivers 111 and 112, match amplifiers 141 to 144, and match line equalizer units 113 and 114.

Referring to FIG. 1, each of the PCAM arrays 121 and 124 is formed in a P channel memory array region, and is constructed by including a plurality of TCAM cells arranged in a matrix of a plurality of M rows by a plurality of K columns to store storage data used for a search operation performed by the TCAM device of FIG. 1. The TCAM cells constituting each of the PCAM arrays 121 and 124 will be referred to as PCAM cells 1 hereinafter. A configuration of each of the PCAM cells 1 will be described later in detail with reference to FIG. 2. In addition, referring to FIG. 1, each of the NCAM arrays 122 and 123 is formed in an N channel memory array region, and is constructed by including a plurality of TCAM cells arranged in a matrix of a plurality of M rows by a plurality of K columns to store storage data used for the search operation performed by the TCAM device of FIG. 1. The TCAM cells constituting each of the NCAM arrays 122 and 123 will be referred to as NCAM cells 11 hereinafter. A configuration of each of the NCAM cells 11 will be described later in detail with reference to FIG. 2.

In this case, each of the PCAM arrays 121 and 124 is constructed by including M word lines WLps and M match lines MLps provided so as to correspond to the memory cell rows, 2K pairs of bit lines BLp and $\overline{BLp}$ provided so as to correspond to the memory cell columns, and K pairs of search lines SLp and $\overline{SLp}$ provided so as to correspond to the TCAM cell columns, respectively. In addition, each of the NCAM arrays 122 and 123 is constructed by including M word lines WLns and M match lines and MLns provided so as to correspond to the memory cell rows, 2K pairs of bit lines BLn and $\overline{BLn}$ provided so as to correspond to the memory cell columns, and K pairs of search lines SLn and $\overline{SLn}$ provided so as to correspond to the TCAM cell columns, respectively. In the following descriptions, the word lines WLps and WLns are generally referred to as word lines WLs, the match lines MLps and MLns are generally referred to as match lines MLs, the paired bit lines BLp and $\overline{BLp}$ and the paired bit lines BLn and $\overline{BLn}$ are generally referred to as paired bit lines BL and $\overline{BL}$, and the paired search lines SLp and $\overline{SLp}$ and the paired search lines SLn and $\overline{SLn}$ are generally referred to as paired search lines SL and $\overline{SL}$ hereinafter.

Referring to FIG. 1, the memory controller 100 generates and outputs control signals for controlling the row decoders 131 to 134, the sense amplifiers 151 to 154, the search line drivers 111 and 112, and the match line equalizer units 113 and 114, respectively, based on address data and command data for designating operation performed by the TCAM device of FIG. 1, which are inputted via the address/command buffer 101.

The row decoder 131 activates one word line WL provided in the PCAM array 121 in response to the control signal transmitted from the memory controller 100 and indicating an address. In addition, the sense amplifier 151 activates one pair of bit lines BL and $\overline{BL}$ in the PCAM array 121 in response to the control signal transmitted from the memory controller 100 and indicating an address. Further, the search line driver 111 activates each pair of search line SL and $\overline{SL}$ in response to the control signal transmitted from the memory controller 100 and indicating search data. Still further, during the search operation performed by the TCAM device of FIG. 1, a level indicating whether or not the search data is matched with the storage data in all of the PCAM cells constituting each memory cell row of the PCAM array 121 is set to the match line ML corresponding to the above each memory cell row, and outputted to a detection circuit, not shown, via the match amplifier 141. The match line equalizer unit 113 is constructed by including M match line equalizer circuits 50 provided so as to correspond to M pairs of match lines MLp of the PCAM array 121 and match lines MLn of the NCAM array 122, respectively. A configuration of the match line equalizer circuit 50 will be described later in detail with reference to FIG. 2.

Each of the row decoders 132 to 134 has a configuration similar to that of the row decoder 131, each of the sense amplifiers 152 to 154 has a configuration similar to that of the sense amplifier 151, and each of the match amplifiers 142 to 144 has a configuration similar to that of the match amplifier 141. The search line driver 112 has a configuration similar to that of the search line driver 111, the match line equalizer unit 114 has a configuration similar to that of the match line equalizer unit 113, and the PCAM array 124 has a configuration similar to that of the PCAM array 121. In addition, each of the NCAM arrays 122 and 123 has such a configuration that the PCAM cells 1 in the PCAM array 121 are replaced by the NCAM cells 11.

Referring to FIG. 2, the PCAM cell 1 of a TCAM cell is constructed by including SRAMs 3 and 4, comparator circuits 5 and 6 of exclusive OR circuits, a word line WLp, a pair of bit lines BLp0 and $\overline{BLp0}$, a pair of bit lines BLp1 and $\overline{BLp1}$, and a pair of search lines SLp and $\overline{SLp}$.

The SRAM 3 of a storage element is constructed by including inverters 81 and 82 connected in parallel in opposite directions, and N channel MOS field effect transistors (referred to as N channel MOSFETs hereinafter) 83 and 84 for data input and output. In the SRAM 3, a drain electrode of the N channel MOSFET 83 is connected to the bit line $\overline{BLp0}$, a gate electrode thereof is connected to the word line WLp, and a source electrode thereof is connected to an input terminal of the inverter 81 and an output terminal of the inverter 82. In addition, a drain electrode of the N channel MOSFET 84 is connected to the bit line BLp0, a gate electrode thereof is connected to the word line WLp, and a source electrode thereof is connected to an output terminal of the inverter 81 and an input terminal of the inverter 82. In this case, a signal indicating a positive logical value of a value stored in the SRAM 3 is outputted from the source electrode of the N channel MOSFET 83. The comparator circuit 5 is constructed by including P channel MOS field effect transistors (referred to as P channel MOSFETs hereinafter) 7 and 8. In the comparator circuit 5, a gate electrode of the P channel MOSFET 8 is connected to the search line SLp, one electrode thereof is connected to a power source outputting a power source voltage VDD, and the other electrode thereof is connected to one electrode of the P channel MOSFET 7. A gate electrode of the P channel MOSFET 7 is connected to the source electrode of the N channel MOSFET 84 of the SRAM 3, and the other electrode thereof is connected to the match line MLp.

Referring to FIG. 2, the SRAM 4 of a storage element is constructed by including inverters 81 and 82 connected in parallel in opposite directions and N channel MOSFETs 83 and 84, and has a configuration similar to that of the SRAM 3. In this case, in the SRAM 4, a drain electrode of the N channel MOSFET 84 is connected to the bit line BLp1 and a drain electrode of the N channel MOSFET 83 is connected to the bit line $\overline{BLp1}$. In addition, the comparator circuit 6 is constructed by including P channel MOSFETs 9 and 10. In the comparator circuit 6, a gate electrode of the P channel MOSFET 10 is connected to the search line $\overline{SLp}$, one electrode thereof is connected to the power source, and the other electrode thereof is connected to one electrode of the P channel MOSFET 9. A gate electrode of the P channel MOSFET 9 is connected to the source electrode of the N channel MOSFET 84 of the SRAM 4 and the other electrode thereof is connected to the match line MLp.

Referring to FIG. 2, the NCAM cell 11 of a TCAM cell is constructed by including SRAMs 13 and 14, comparator circuits 15 and 16 of exclusive OR circuits, a word line WLn, a pair of bit lines BLn0 and $\overline{BLn0}$, a pair of bit lines BLn1 and $\overline{BLn1}$, and a pair of search lines SLn and $\overline{SLn}$.

Referring to FIG. 2, each of the SRAMs 13 and 14 of storage elements is constructed by including the inverters 81 and 82 connected in parallel in opposite directions and the N channel MOSFETs 83 and 84, and has a configuration similar to that of the SRAM 3. In this case, in the SRAM 13, a drain electrode of the N channel MOSFET 83 is connected to the bit line $\overline{BLn0}$, a drain electrode the N channel MOSFET 84 is connected to the bit line BLn0, and gate electrodes of N channel MOSFETs 83 and 84 are connected to the word line WLn, respectively. In addition, in the SRAM 14, a drain electrode of the N channel MOSFET 83 is connected to the bit line $\overline{BLn1}$, a drain electrode the N channel MOSFET 84 is connected to the bit line BLn1, and gate electrodes of N channel MOSFETs 83 and 84 are connected to the word line WLn, respectively.

In addition, the comparator circuit 15 is constructed by including N channel MOSFETs 17 and 18. In the comparator circuit 15, a gate electrode of the N channel MOSFET 18 is connected to the search line SLn, one electrode thereof is grounded, and the other electrode thereof is connected to one electrode of the N channel MOSFET 17. A gate electrode of the N channel MOSFET 17 is connected to the source electrode of the N channel MOSFET 84 of the SRAM 13 and the other electrode thereof is connected to the match line MLn. Further, the comparator circuit 16 is constructed by including N channel MOSFETs 19 and 20. In the comparator circuit 16, a gate electrode of the N channel MOSFET 20 is connected to the search line $\overline{SLn}$, one electrode thereof is grounded, and the other electrode thereof is connected to one electrode of the N channel MOSFET 19. A gate electrode of the N channel MOSFET 19 is connected to the source electrode of the N channel MOSFET 84 of the SRAM 14 and the other electrode thereof is connected to the match line MLn.

Referring to FIG. 2, the match equalizer circuit 50 is constructed by including a P channel MOSFET 21, an N channel MOSFET 22, and a CMOS switch having an N channel MOSFET 23 and a P channel MOSFET 24. In this case, an inverted reset signal $\overline{RST}$ from the memory controller 100 is inputted to a gate electrode of the P channel MOSFET 21, one electrode of the P channel MOSFET 21 is connected to the power source, and the other electrode thereof is connected to the match line MLp. In addition, a reset signal RST from the memory controller 100 is inputted to a gate electrode of the N channel MOSFET 22, one electrode of the N channel MOSFET 22 is grounded, and the other electrode thereof is connected to the match line MLn. Further, a match line equalization signal EQ from the memory controller 100 is inputted to a gate electrode of the N channel MOSFET 23, one electrode of the N channel MOSFET 23 is connected to the match line MLp, and the other electrode thereof is connected to the match line MLn. An inverted match line equalization signal $\overline{EQ}$ from the memory controller 100 is inputted to a gate electrode of the P channel MOSFET 24, one electrode of the P channel MOSFET 24 is connected to the match line MLp, and the other electrode thereof is connected to the match line MLn.

Figure 3:
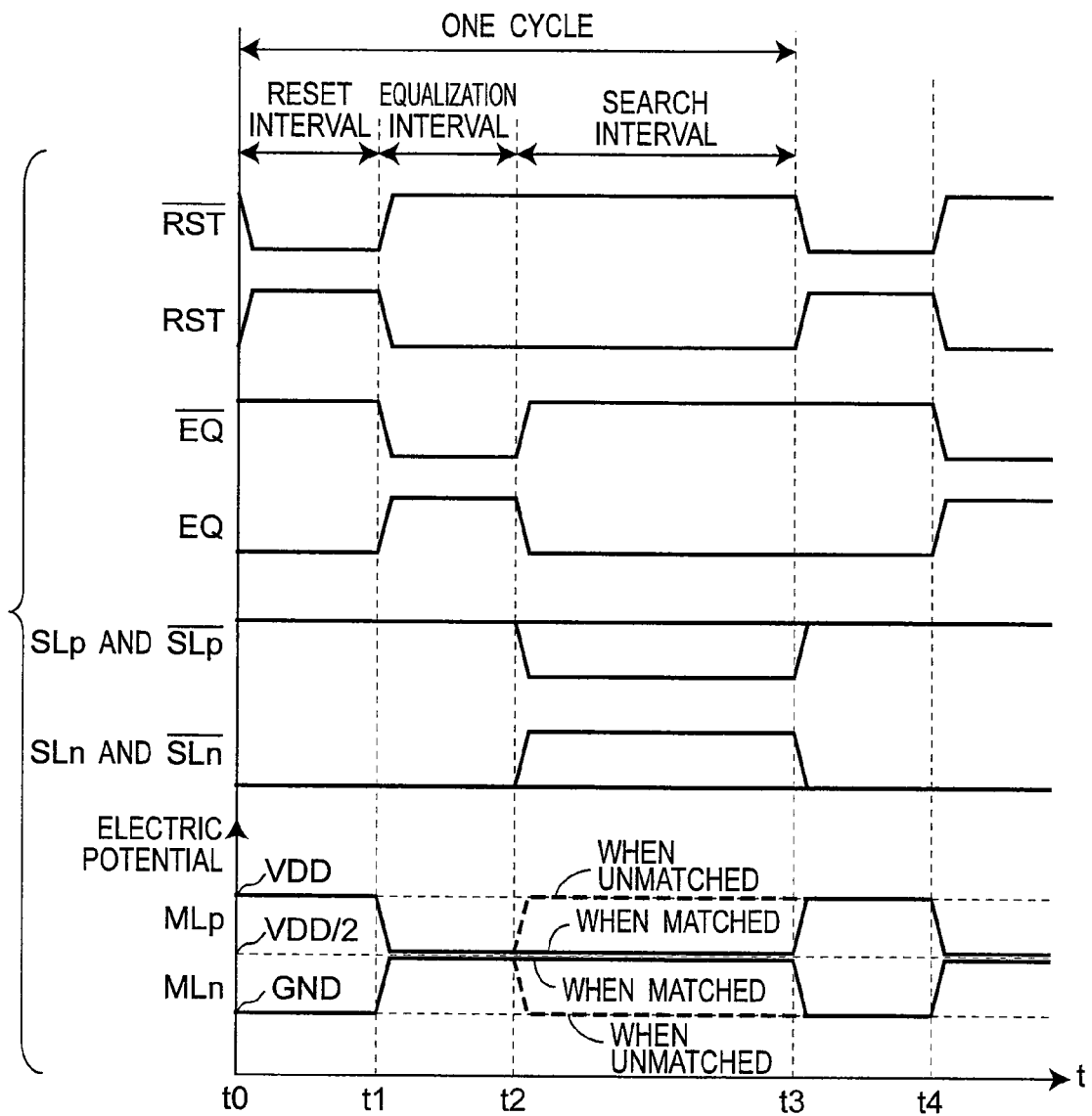
FIG. 3 is a timing chart showing an example of operation performed by the TCAM device of FIG. 1.

FIG. 3 is a timing chart showing an example of operation performed by the TCAM device of FIG. 1. Referring to FIG. 3, an interval from timings t0 to t3 indicates one cycle of the search operation performed by the TCAM device of FIG. 1. In this case, one cycle of the search operation includes a reset interval from timings t0 to t1, an equalization interval from timings t1 to t2, and a search interval from timings t2 to t3.

At the timing t0 of FIG. 3, the memory controller 100 of FIG. 1 generates the inverted reset signal $\overline{RST}$ having a low level, and outputs the same signal to the gate electrode of the P channel MOSFET 21. In addition, the memory controller 100 generates the reset signal RST having a high level, and outputs the same signal to the gate electrode of the N channel MOSFET 22. In response to this, the P channel MOSFET 21 and the N channel MOSFET 22 are set to conductive states, respectively. Further, at the timing t0, the memory controller 100 generates the match line equalization signal EQ having the low level, and outputs the same signal to the gate electrode of the N channel MOSFET 23. In addition, the memory controller 100 generates the inverted match line equalization signal $\overline{EQ}$ having the high level, and outputs the same signal to the gate electrode of the P channel MOSFET 24. In response to this, the N channel MOSFET 23 and the P channel MOSFET 24 are set to nonconductive states, respectively. Accordingly, at the timing t0, the match line MLp is connected to the power source, and an electric potential of the match line MLp is reset to the power source electric potential VDD. In addition, the match line MLn is grounded, and an electric potential of the match line MLn is reset to a ground electric potential GND. In the reset interval of FIG. 3, the paired search lines SLp and $\overline{SLp}$ are set to the high level, respectively, and the paired search lines SLn and $\overline{SLn}$ are set to the low level, respectively.

At the timing t1, the memory controller 100 of FIG. 1 generates the inverted reset signal $\overline{RST}$ having the high level, and outputs the same signal to the gate electrode of the P channel MOSFET 21. In addition, the memory controller 100 generates the reset signal RST having the low level, and outputs the same signal to the gate electrode of the N channel MOSFET 22. In response to this, the P channel MOSFET 21 and the N channel MOSFET 22 are set to the nonconductive states, respectively. Further, at the timing t1, the memory controller 100 generates the match line equalization signal EQ having the high level, and outputs the same signal to the gate electrode of the N channel MOSFET 23. In addition, the memory controller 100 generates the inverted match line equalization signal $\overline{EQ}$ having the low level, and outputs the same signal to the gate electrode of the P channel MOSFET 24. In response to this, the N channel MOSFET 23 and the P channel MOSFET 24 are set the conductive states, respectively. Accordingly, at the timing t1, the match line MLp is cut off from the power source, the match line MLn is cut off from the ground electric potential GND, and the match lines MLp and MLn are electrically connected to each other. Consequently, each of the electric potentials of the match lines MLp and MLn is set to an electric potential VDD/2. In the equalization interval of FIG. 3, the paired search lines SLp and $\overline{SLp}$ are set to the high level, respectively, and the paired search lines SLn and $\overline{SLn}$ are set to the low level, respectively.

In the search interval of FIG. 3, the memory controller 100 of FIG. 1 generates the inverted reset signal $\overline{RST}$ having the high level, and outputs the same signal to the gate electrode of the P channel MOSFET 21. In addition, the memory controller 100 generates the reset signal RST having the low level, and outputs the same signal to the gate electrode of the N channel MOSFET 22. Further, the memory controller 100 generates the match line equalization signal EQ having the low level, and outputs the same signal to the gate electrode of the N channel MOSFET 23. Still further, the memory controller 100 generates the match line equalization inversion signal $\overline{EQ}$ having the high level, and outputs the same signal to the gate electrode of the P channel MOSFET 24. In response to this, the P channel MOSFETs 21 and 24 and the N channel MOSFETs 22 and 23 are set to the nonconductive states, respectively.

In addition, in the search interval, the memory controller 100 outputs the search data to the paired search lines SLp and $\overline{SLp}$, and the paired search lines SLn and $\overline{SLn}$. When the storage data of the SRAM 3 is matched with the search data of the search line SLp and the storage data of the SRAM 4 is matched with the search data of the search line $\overline{SLp}$, the electric potential of the match line MLp is hold equal to the electric potential VDD/2 as indicated by "when matched" in FIG. 3. Otherwise, the electric potential of the match line MLp rises to the power source electric potential VDD as indicated by "when unmatched" in FIG. 3. In addition, when the storage data of the SRAM 3 is matched with the search data of the search line $\overline{SLn}$ and the storage data of the SRAM 14 is matched with the search data of the search line SLn, the electric potential of the match line MLp is hold equal to the electric potential VDD/2 as indicated by "when matched" in FIG. 3. Otherwise, the electric potential of the match line MLn falls to the ground electric potential GND as indicated by "when unmatched" in FIG. 3. The electric potentials of the match lines MLp and MLn are detected by the detection circuit, not shown, via the match amplifiers 141 and 142 of FIG. 1, respectively.

After the timing t3 of FIG. 3, the TCAM device of FIG. 1 repeatedly performs the operations in one cycle of the interval from the timings t0 to t3, to repeat the search operation. Generally speaking, most of the storage data is not matched with the search data. Accordingly, in the search interval of FIG. 3, the electric potentials of most of the match lines MLp rise to the power source electric potential VDD, and the electric potentials of most of the match lines MLn fall to the ground electric potential GND. The TCAM device according to the first preferred embodiment performs a charge recycling for utilizing electric charges obtained by charging the match lines MLP with the power source electric potential VDD as electric charges for the match lines MLn in a next reset interval (timings t3 to t4 of FIG. 3). Therefore, as compared with the prior art, the TCAM device of FIG. 1 exhibits such an advantageous effect that the power consumption and the peak current can be reduced to a quarter of those of the prior art, respectively. It is to be noted that each match line MLn determined to be "matched" in the search interval will be discharged in the next reset interval. However, the number of discharged match lines MLn is relatively small, and therefore, the discharged electric charge is only few as compared with the power consumption of the entire TCAM device of FIG. 1.

In FIG. 2, the connection relation between the P channel MOSFETs 7 and 8 may be opposite to each other. In this case, the gate electrode of the P channel MOSFET 8 is connected to the source electrode of the N channel MOSFET 84 of the SRAM 3, one electrode thereof is connected to the power source outputting the power source voltage VDD, and the other electrode thereof is connected to one electrode of the P channel MOSFET 7. In addition, the gate electrode of the P channel MOSFET 7 is connected to the search line SLp, and the other electrode thereof is connected to the match line MLp. Further, the connection relations between the N channel MOSFETs 17 and 18, the P channel MOSFETs 9 and 10, and the channel MOSFETs 19 and 20 may be opposite to each other, respectively, in a manner similar to that of the connection relation between the P channel MOSFETs 7 and 8.

In addition, in FIG. 2, the SRAMs 3, 4, 13, and 14 may be replaced by the other storage elements such as DRAMs.

It is to be noted that the characteristic configuration and modified preferred embodiment of the first preferred embodiment are similarly applicable to the preferred embodiments to be described later.

Second Preferred Embodiment

Figure 4:
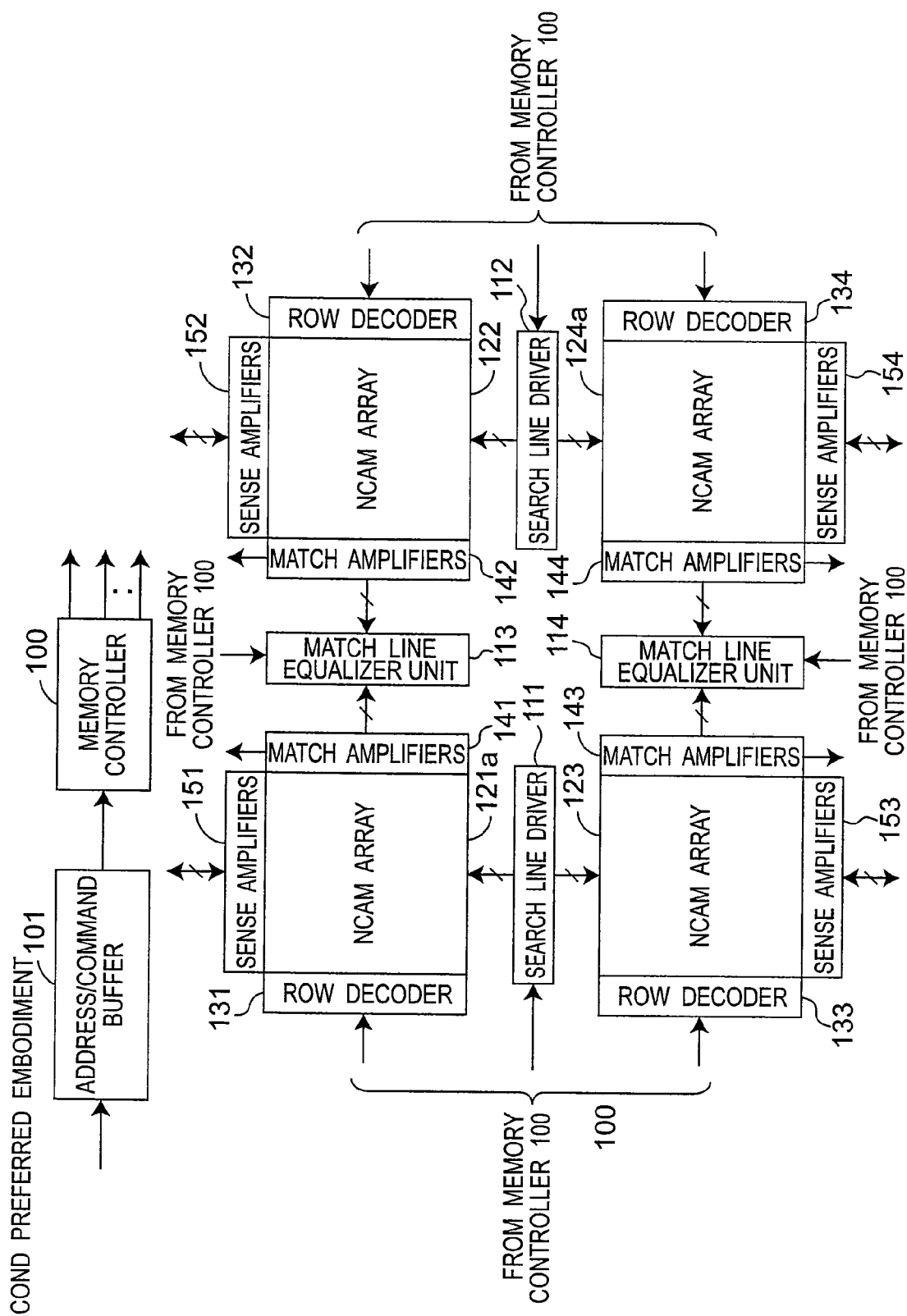
FIG. 4 is a block diagram showing a configuration of a TCAM device of a content addressable memory device according to a second preferred embodiment of the present invention.
Figure 5:
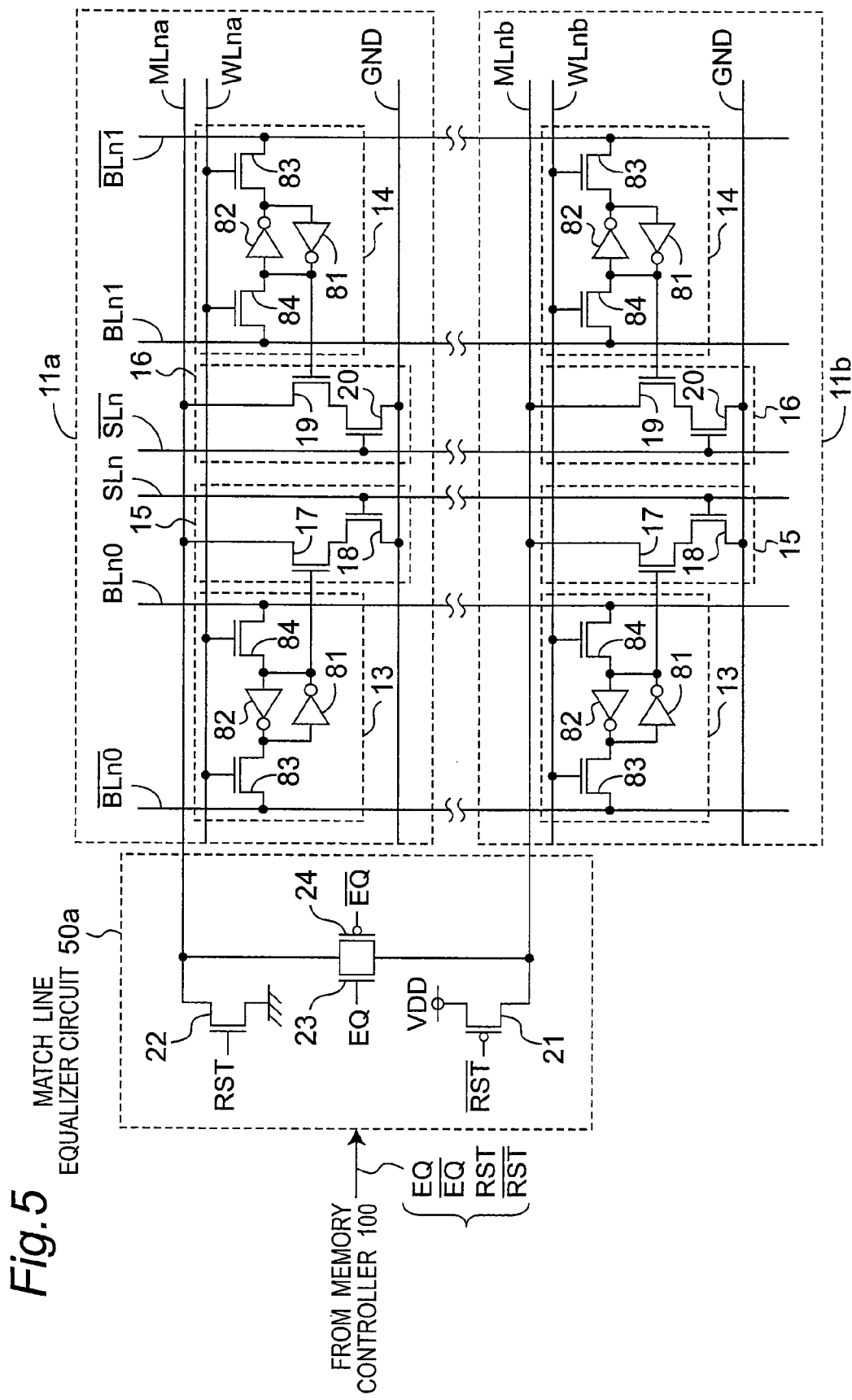
FIG. 5 is a circuit diagram showing configurations of an NCAM cell 11a that is one of NCAM cells 11a constituting an NCAM array 121a of FIG. 4, a match line equalizer circuit 50a that is one of match line equalizer circuits 50a constituting a match line equalizer unit 113 of FIG. 4, and an NCAM cell 11b that is one of NCAM cells 11b constituting an NCAM array 122 of FIG. 4.

FIG. 4 is a block diagram showing a configuration of a TCAM device of a content addressable memory device according to a second preferred embodiment of the present invention. FIG. 5 is a circuit diagram showing configurations of an NCAM cell 11a that is one of NCAM cells 11a constituting an NCAM array 121a of FIG. 4, a match line equalizer circuit 50a that is one of match line equalizer circuits 50a constituting a match line equalizer unit 113 of FIG. 4, and an NCAM cell 11b that is one of NCAM cells 11b constituting an NCAM array 122 of FIG. 4. As shown in FIG. 4, as compared with the TCAM device according to the first preferred embodiment, the TCAM device according to the second preferred embodiment is characterized by including the NCAM array 121a in stead of the PCAM array 121 and an NCAM array 124a in stead of the PCAM array 124. The other configurations according to the second preferred embodiment are similar to those of the TCAM device according to the first preferred embodiment.

Referring to FIG. 5, each of the NCAM cells 11a and 11b has a configuration similar to that of the NCAM cell 11 of FIG. 2 except for the following respects. The NCAM cell 11a includes a match line MLna in stead of the match line MLn, and a word line WLna in stead of the word line WLn as compared with the NCAM cell 11. In addition, the NCAM cell 11b includes a match line MLnb in stead of the match line MLn, and a word line WLnb in stead of the word line WLn as compared with the NCAM cell 11. Further, referring to FIG. 5, the match line equalizer circuit 50a has a configuration similar to that the match line equalizer circuit 50 of FIG. 2 except for the following respects. The inverted reset signal $\overline{RST}$ from a memory controller 100 is inputted to the gate electrode of the P channel MOSFET 21, one electrode of the P channel MOSFET 21 is connected to the power source, and the other electrode thereof is connected to the match line MLnb. In addition, a reset signal RST from the memory controller 100 is inputted to the gate electrode of the N channel MOSFET 22, one electrode of the N channel MOSFET 22 is grounded, and the other electrode thereof is connected to the match line MLna. In a manner similar to that of the memory controller 100 according to the first preferred embodiment, the memory controller 100 of FIG. 5 generates and output the control signals EQ, $\overline{EQ}$, RST, and $\overline{RST}$.

Figure 6:
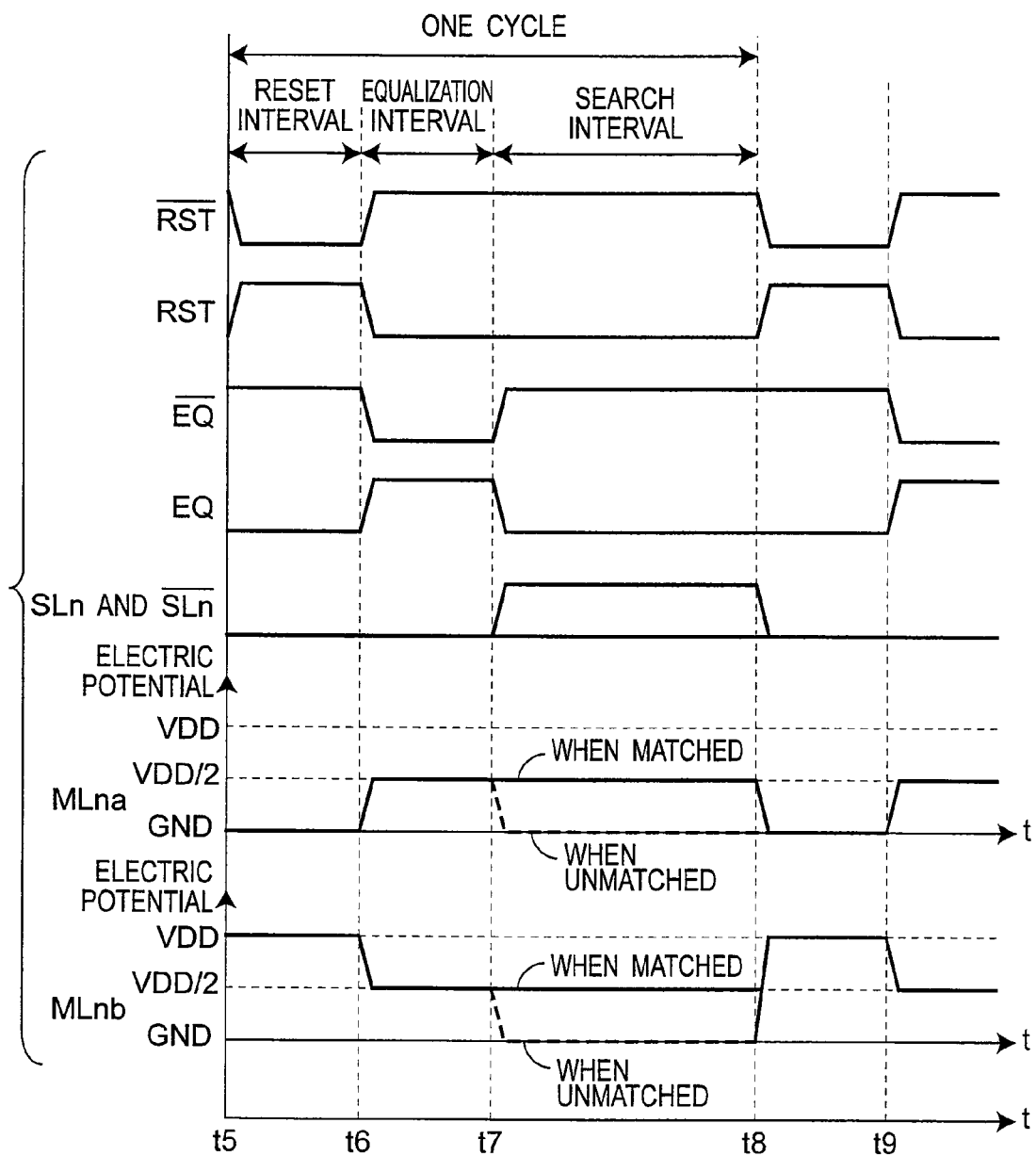
FIG. 6 is a timing chart showing an example of operation performed by the TCAM device of FIG. 4.

FIG. 6 is a timing chart showing an example of operation performed by the TCAM device of FIG. 4. As shown in FIG. 6, for a search operation performed by the TCAM device of FIG. 4, an electric potential of the match line MLna changes in a manner similar to that of the electric potential of the match line MLn of FIG. 3. In addition, for a reset interval from timings t5 to t6 and an equalization interval from timings t6 to t7, an electric potential of the match line MLnb changes in a manner similar to that of the electric potential of the match line MLp of FIG. 3. Further, for a search interval from timings t7 to t8, the electric potential of the match line MLnb changes in a manner similar to that of the electric potential of the match line MLp shown in FIG. 3, when the storage data of the SRAM 13 of the NCAM cell 11b is matched with the search data of the search line SLn and the storage data of the SRAM 14 of the NCAM cell 11b is matched with the search data of a search line $\overline{SLn}$ as indicated by "when matched" in FIG. 6. However, otherwise, as indicated by "when unmatched" in FIG. 6, for the search interval from timings t7 to t8, the electric potential of the match line MLnb falls to the ground electric potential GND. Generally speaking, as stated above, most of the storage data are unmatched with the search data, and therefore, the electric potentials of most of the match line MLna and MLnb fall to the ground electric potential VDD in the search interval of FIG. 6. Therefore, most of the power consumptions of the TCAM device according to the second preferred embodiment occur when the match line MLnb is charged from the ground electric potential GND to the power source electric potential VDD at the timing t8. Accordingly, the TCAM device according to the second preferred embodiment exhibits such an advantageous effect that it can reduce the power consumption and the peak current thereof to a half of those of the prior art, respectively. In addition, the TCAM device according to the second preferred embodiment has the effects of reducing the current consumption and the peak current thereof smaller than those of the first preferred embodiment, however, exhibits such an advantageous effect that a circuit scale thereof can be reduced by using one type of memory cells.

Third Preferred Embodiment

Figure 7:
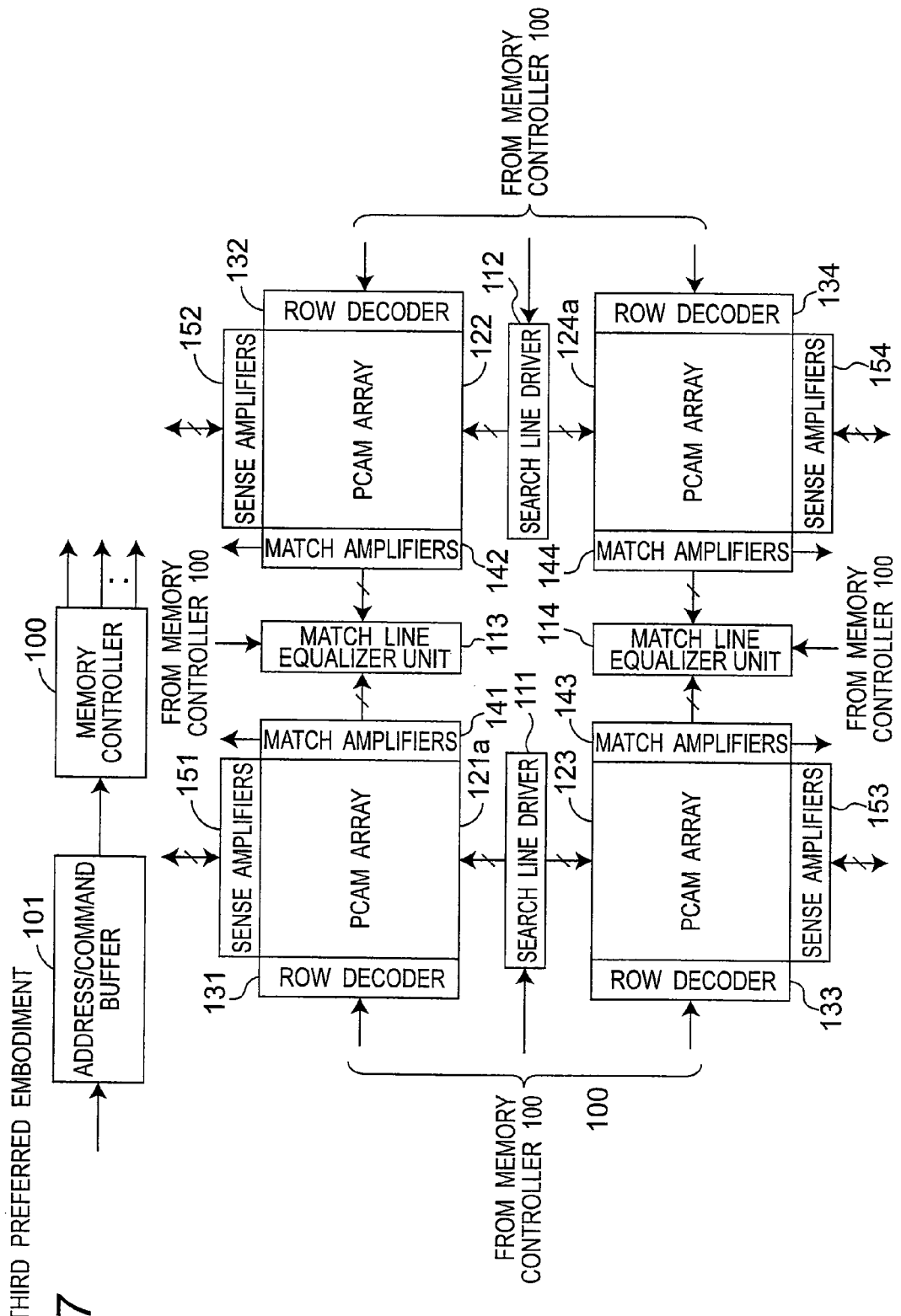
FIG. 7 is a block diagram showing a configuration of a TCAM device of a content addressable memory device according to a third preferred embodiment of the present invention.
Figure 8:
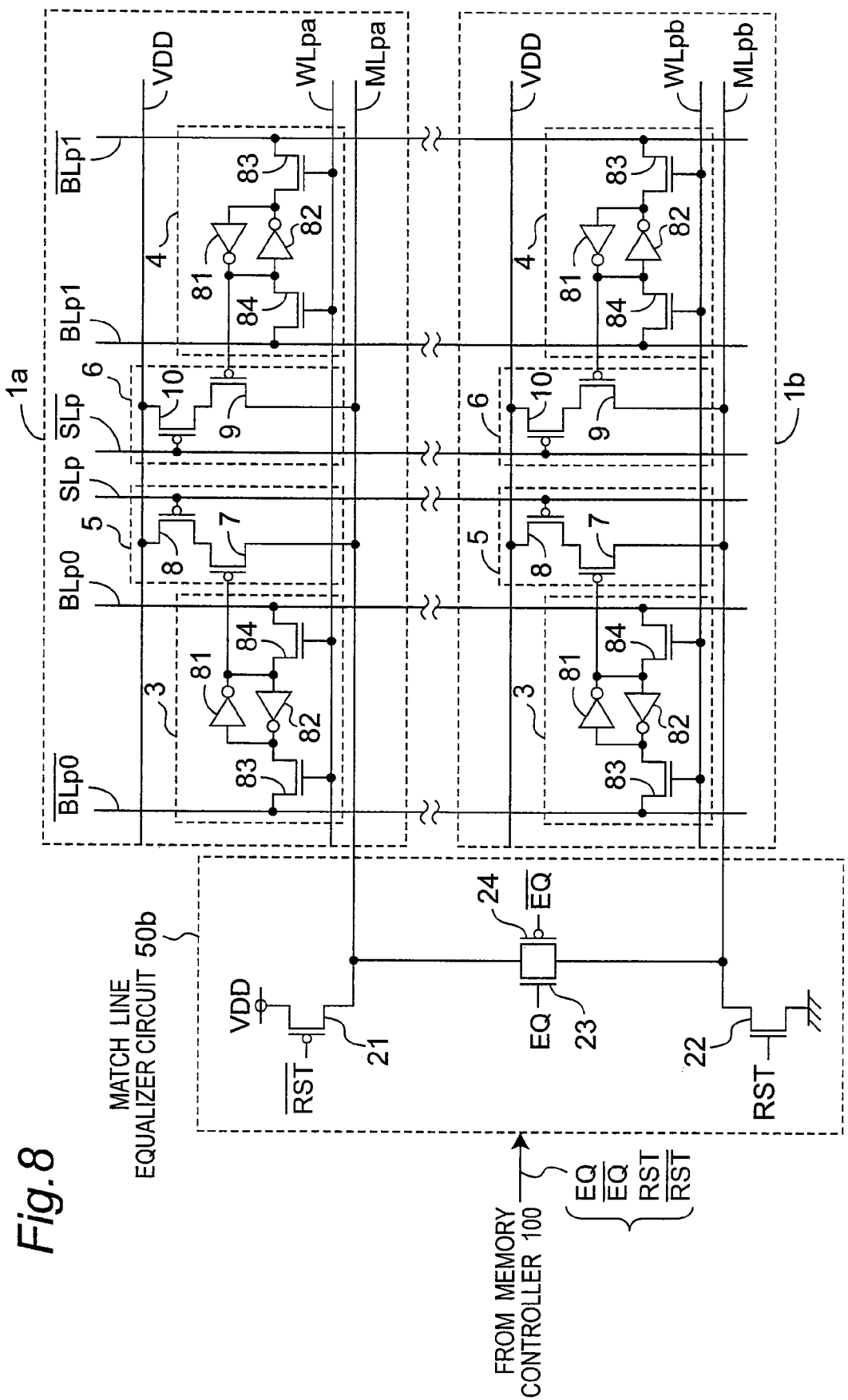
FIG. 8 is a circuit diagram showing configurations of a PCAM cell 1a that is one of PCAM cells 1a constituting a PCAM array 121 of FIG. 7, a match line equalizer circuit 50b that is one of match line equalizer circuits 50b constituting a match line equalizer unit 113 of FIG. 7, and a PCAM cell 1b that is one of PCAM cells 1b constituting a PCAM array 122a of FIG. 7.

FIG. 7 is a block diagram showing a configuration of a TCAM device of a content addressable memory device according to a third preferred embodiment of the present invention. FIG. 8 is a circuit diagram showing configurations of a PCAM cell 1a that is one of PCAM cells 1a constituting a PCAM array 121 of FIG. 7, a match line equalizer circuit 50b that is one of match line equalizer circuits 50b constituting a match line equalizer unit 113 of FIG. 7, and a PCAM cell 1b that is one of PCAM cells 1b constituting a PCAM array 122a of FIG. 7. As shown in FIG. 7, as compared with the TCAM device according to the first preferred embodiment, the TCAM device according to the third preferred embodiment is characterized by including a PCAM array 122a in stead of the NCAM array 122 and a PCAM array 123a in stead of the NCAM array 123. The other configurations according to the third preferred embodiment are similar to those of the TCAM device according to the first preferred embodiment.

Referring to FIG. 8, each of the PCAM cells 1a and 1b has a configuration similar to that of the PCAM cell 1 of FIG. 2 except for the following respects. The PCAM cell 1a includes a match line MLpa in stead of the match line MLp, and a word line WLpa in stead of the word line WLp as compared with the PCAM 1. In addition, the PCAM cell 1b includes a match line MLpb in stead of the match line MLp, and a word line WLpb in stead of the word line WLp as compared with the PCAM 1. Further, in FIG. 8, the match line equalizer circuit 50b has a configuration similar to that of the match line equalizer circuit 50 of FIG. 2 except for the following respects. The inverted reset signal $\overline{RST}$ from the memory controller 100 is inputted to the gate electrode of the P channel MOSFET 21, one electrode of the P channel MOSFET 21 is connected to the power source, and the other electrode thereof is connected to the match line MLpa. In addition, the reset signal RST from the memory controller 100 is inputted to the gate electrode of the N channel MOSFET 22, one electrode of the N channel MOSFET 22 is grounded, and the other electrode thereof is connected to the match line MLpb. In a manner similar to that of the memory controller 100 according to the first preferred embodiment, the memory controller 100 of FIG. 7 generates and output the control signals EQ, $\overline{EQ}$, RST, and $\overline{RST}$.

Figure 9:
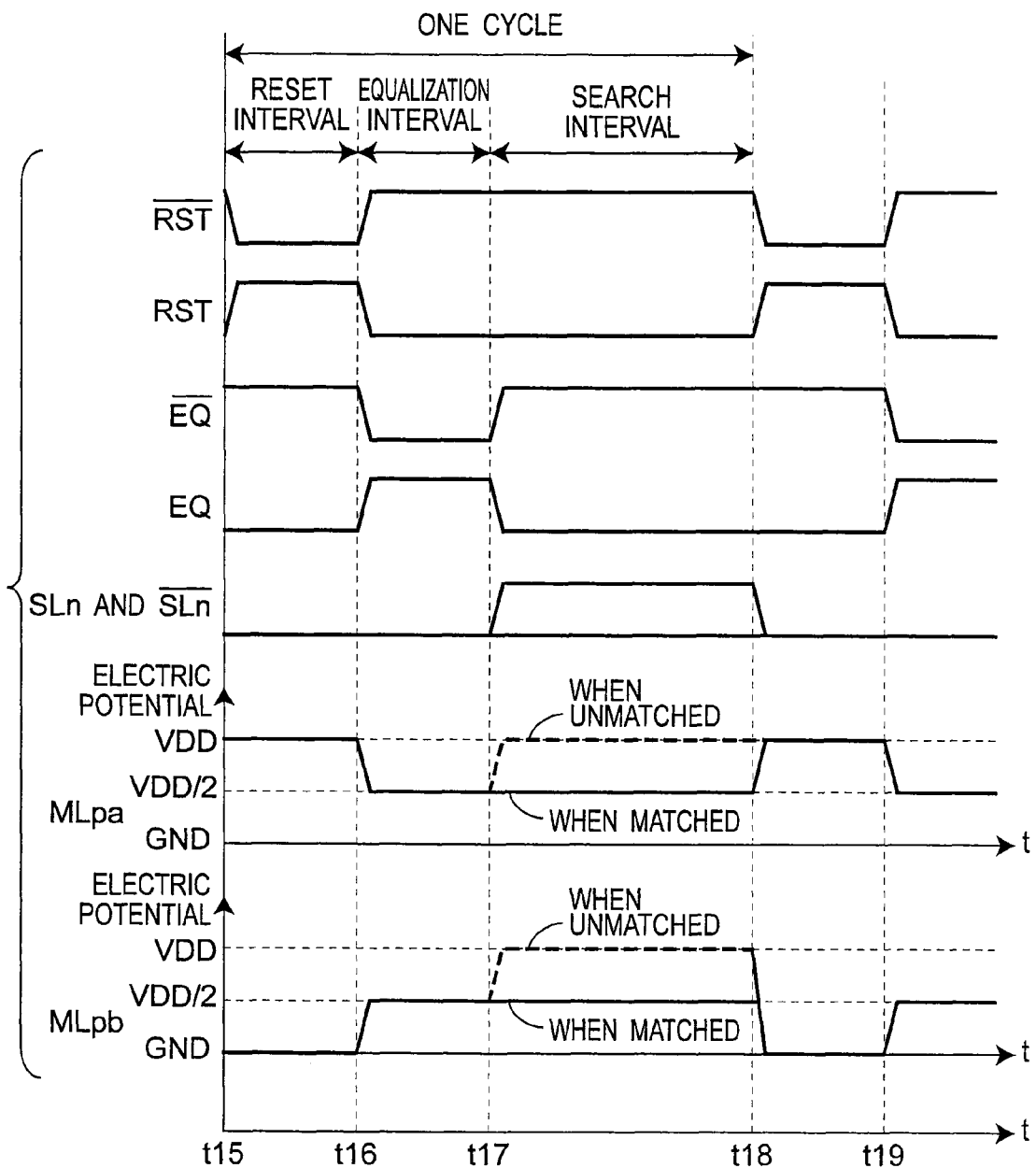
FIG. 9 is a timing chart showing an example of operation performed by the TCAM device of FIG. 7.

FIG. 9 is a timing chart showing an example of operation performed by the TCAM device of FIG. 7. As shown in FIG. 9, for a search operation performed by the TCAM device of FIG. 7, an electric potential of the match line MLpa changes in a manner similar to that of the electric potential of the match line MLp of FIG. 3. In addition, for a reset interval from timings t15 to t16 and an equalization interval from timings t16 to t17, an electric potential of the match line MLpb changes in a manner similar to that of the electric potential of the match line MLn of FIG. 3. Further, for a search interval from timings t17 to t18, the electric potential of the match line MLpb changes in a manner similar to that of the electric potential of the match line MLn of FIG. 3, when the storage data of the SRAM 3 of the PCAM cell 1b is matched with the search data of the search line SLp and the storage data of the SRAM 4 of the PCAM cell 1b is matched with the search data of the search line $\overline{SLp}$ as indicated by "when matched" in FIG. 9. However, otherwise, as indicated by "when unmatched" in FIG. 9, for the search interval from timings t17 to t18, the electric potential of the match line MLpb rises to the power source electric potential VDD. Generally speaking, as stated above, most of the storage data are not matched with the search data, and therefore, the electric potentials of most of the match lines MLpa and MLpb rise to the power source electric potential VDD in the search interval of FIG. 9. Therefore, most of the power consumptions of the TCAM device according to the third preferred embodiment occur when the match line MLpb is discharged from the power source electric potential VDD to the ground electric potential GND at the timing t18. Accordingly, the TCAM device according to the third preferred embodiment exhibits such an advantageous effect that it can reduce the power consumption and the peak current thereof to a half of those of the prior art, respectively. In addition, the TCAM device according to the third preferred embodiment has the effects of reducing the current consumption and the peak current thereof smaller than those of the first preferred embodiment, however, exhibits such an advantageous effect that a circuit scale thereof can be reduced by using one type of memory cells.

Fourth Preferred Embodiment

Figure 10:
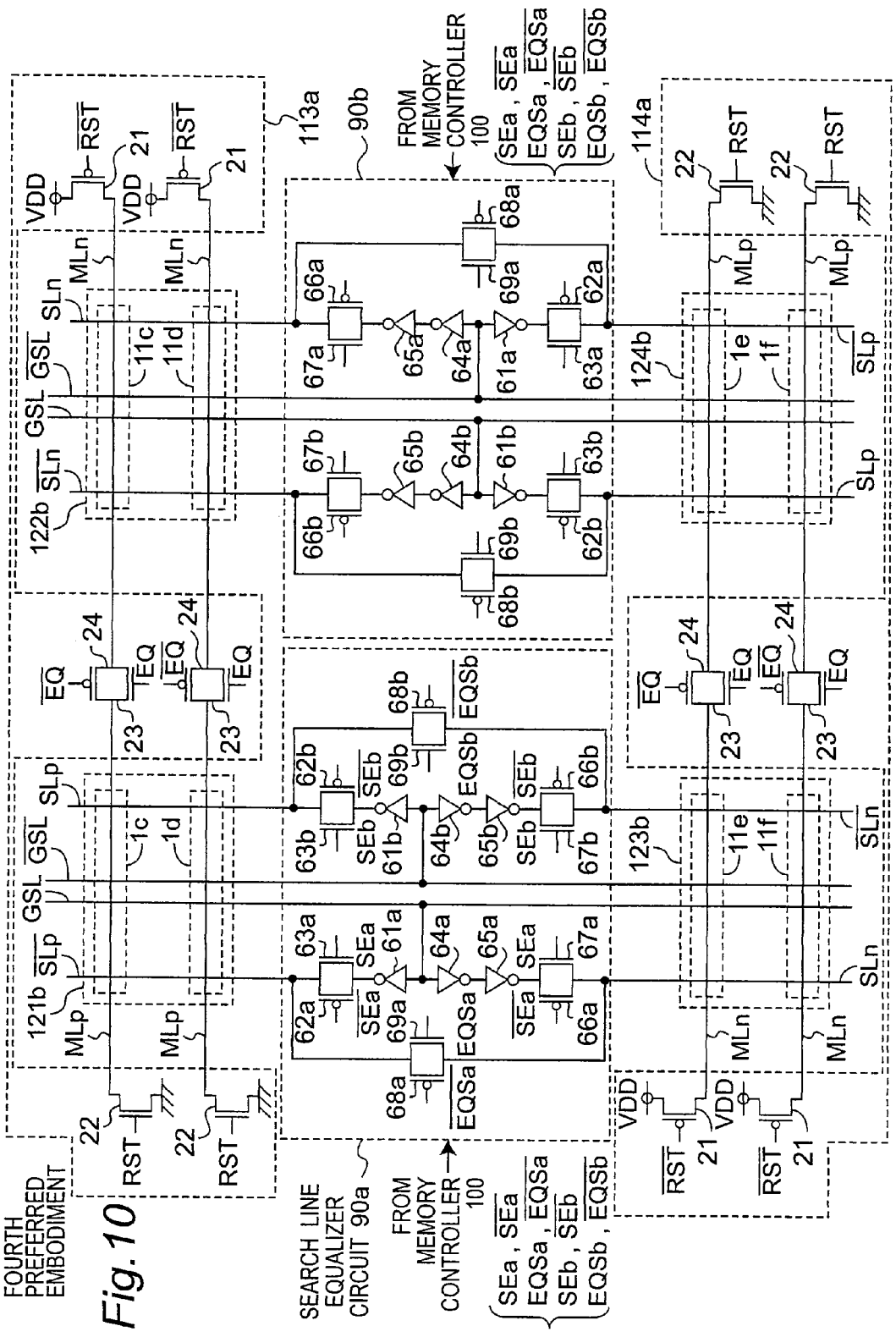
FIG. 10 is a block diagram showing a configuration of a TCAM device of a content addressable memory device according to a fourth preferred embodiment of the present invention.

FIG. 10 is a block diagram showing a configuration of a TCAM device of a content addressable memory device according to a fourth preferred embodiment of the present invention. As compared with the TCAM device according to the first preferred embodiment of FIG. 1, the TCAM device according to the fourth preferred embodiment is characterized as follows. The TCAM device according to the fourth preferred embodiment includes PCAM arrays 121b and 124b and NCAM arrays 122b and 123b in stead of the PCAM arrays 121 and 124 and NCAM arrays 122 and 123, respectively, and match line equalizer units 113a and 114a in stead of the match line equalizer units 113 and 114, respectively. The TCAM device according to the fourth preferred embodiment further includes search line equalizer circuits 90a and 90b and pairs of global search line GSL and $\overline{GSL}$. The TCAM device of FIG. 10 is characterized by having a hierarchical search line configuration including the pairs of global search line GSL and $\overline{GSL}$ and pairs of local search lines SLp and $\overline{SLp}$ and SLn and $\overline{SLn}$. It is to be noted that the address/command buffer 101, the memory controller 100, the row decoders 131 to 134, the sense amplifiers 151 to 154, the search line drivers 111 and 112, and the match amplifiers 131 to 144 are omitted and not shown in FIG. 10.

Referring to FIG. 10, the PCAM array 121b includes PCAM cells 1c and 1d in two rows by one column. In this case, each of the PCAM cells 1c and 1d is configured so that the P channel MOSFETs 8 and 10 in the PCAM cell 1 of FIG. 2 are grounded without being connected to the power source. In addition, the NCAM array 122b includes NCAM cells 11c and 11d in two rows by one column. In this case, each of the NCAM cells 11c and 11d is configured so that the N channel MOSFETs 18 and 20 in the NCAM cell 11 of FIG. 2 are connected to the power source without being grounded. Further, the NCAM array 123b includes NCAM cells 11e and 11f in two rows by one column, and has a configuration similar to that of the NCAM array 122b. Still further, the PCAM array 124b includes PCAM cells 1e and 1f in two rows by one column, and has a configuration similar to that of the PCAM array 121b.

Referring to FIG. 10, each of the match line equalizer units 113a and 114a includes two match line equalizer circuits. In this case, as compared with the match line equalizer circuit 50 of FIG. 2, each of the match line equalizer circuits is configured so that the match line MLn is connected to the P channel MOSFET 21 and the match line MLp is connected to the N channel MOSFET 22.

In addition, referring to FIG. 10, the search line equalizer circuits 90a and 90b have configurations the same as each other. The search line equalizer circuit 90a is constructed by including inverters 61a, 64a, 65a, 61b, 64b and 65b, P channel MOSFETs 62a, 68a, 66a, 62b, 68b and 66b, and N channel MOSFETs 63a, 69a, 67a, 63b, 69b, and 67b. In this case, on the sheet of FIG. 10, a left half of the search line equalizer circuit 90a has a configuration similar to that of a right half thereof, and therefore, only the left half will be described. The global search line GSL is connected to the search line $\overline{SLp}$ via the inverter 61a, and a CMOS switch constructed by including the P channel MOSFET 62a and the N channel MOSFET 63a. The inverter 61a is provided so that the data of the search line $\overline{SLp}$ is inverted with respect to the data of the global search line GSL. The global search line GSL is connected to the search line SLn via the inverters 64a and 65a, and a CMOS switch constructed by including the P channel MOSFET 66a and the N channel MOSFET 67a. The inverters 64a and 65a are provided so that the data of the search line SLn and the data of the global search line GSL are in-phase. Further, the search lines $\overline{SLp}$ and SLn are electrically connected to each other via a CMOS switch constructed by including the P channel MOSFET 68a and the N channel MOSFET 69a. On the sheet of FIG. 10, a circuit of the right half of the search line equalizer circuit 90a is configured so that inverted data of the global search line $\overline{GSL}$ is outputted to the search line SLp, in-phase data of the global search line $\overline{GSL}$ is outputted to the search line $\overline{SLn}$, and the search lines SLp and SLn are electrically connected to each other via a CMOS switch.

As shown in FIG. 10, control signals $\overline{SEa}$, $\overline{EQSa}$, $\overline{SEa}$, $\overline{SEb}$, $\overline{EQSb}$ and $\overline{SEb}$ from the memory controller 100 are inputted to gate electrodes of the P channel MOSFETs 62a, 68a, 66a, 62b, 68b and 66b, respectively. Further, control signals SEa, EQSa, SEa, SEb, EQSb and SEb from the memory controller 100 are inputted to gate electrodes of the N channel MOSFETs 63a, 69a, 67a, 63b, 69b and 67b, respectively.

Figure 11A:
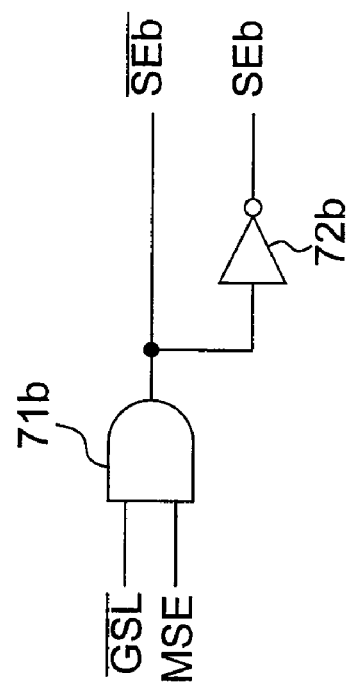
FIG. 11A is a circuit diagram showing a generator circuit for generating control signals $\overline{SEa}$ and SEa of FIG. 10.
Figure 11B:
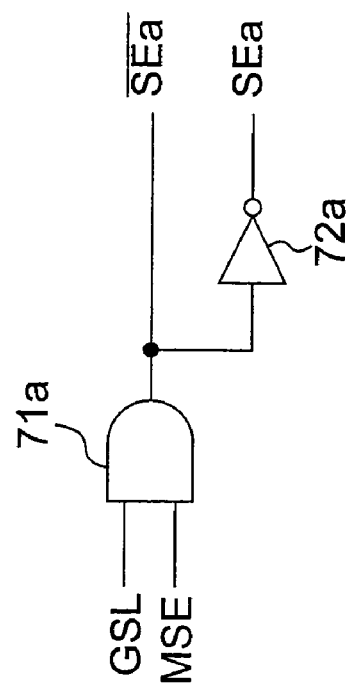
FIG. 11B is a circuit diagram showing a generator circuit for generating control signals $\overline{SEb}$ and SEb of FIG. 10.
Figure 11C:
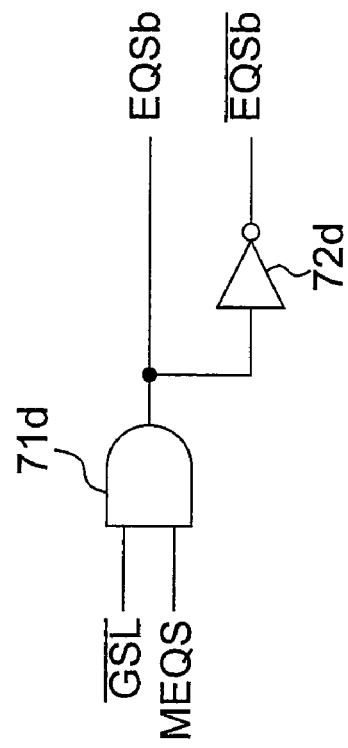
FIG. 11C is a circuit diagram showing a generator circuit for generating control signals EQSa and $\overline{EQSa}$ of FIG. 10.
Figure 11D:
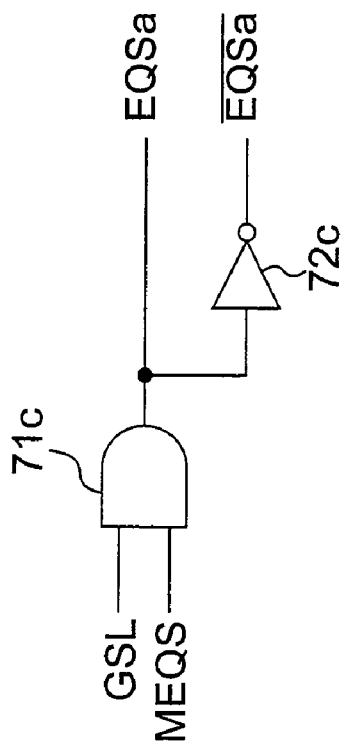
FIG. 11D is a circuit diagram showing a generator circuit for generating control signals EQSb and $\overline{EQSb}$ of FIG. 10.

FIG. 11A is a circuit diagram showing a generator circuit for generating the control signals $\overline{SEa}$ and SEa of FIG. 10, and FIG. 11B is a circuit diagram showing a generator circuit for generating the control signals $\overline{SEb}$ and SEb of FIG. 10. In addition, FIG. 11C is a circuit diagram showing a generator circuit for generating the control signals EQSa and $\overline{EQSa}$ of FIG. 10, and FIG. 11D is a circuit diagram showing a generator circuit for generating the control signals EQSb and $\overline{EQSb}$ of FIG. 10. The circuits of FIGS. 11A to 11D are provided in the memory controller 100, respectively. Referring to FIG. 11A, the global search line GSL is connected to a first input terminal of an AND gate 71a, and a control signal MSE, to be described later in detail, from the memory controller 100 is outputted to a second terminal of the AND gate 71a. In addition, an output signal from the AND gate 71a is outputted as the control signal $\overline{SEa}$, and outputted as the control signal SEa via an inverter 72a. Referring to FIG. 11B, the global search line $\overline{GSL}$ is connected to a first input terminal of an AND gate 71b, and the control signal MSE, to be described later in detail, from the memory controller 100 is outputted to a second terminal of the AND gate 71b. In addition, an output signal from the AND gate 71b is outputted as the control signal SEb, and outputted as the control signal SEb via an inverter 72b. Referring to FIG. 11C, the global search line GSL is connected to a first input terminal of an AND gate 71c, and a control signal MEQS, to be described later in detail, from the memory controller 100 is outputted to a second terminal of the AND gate 71c. In addition, an output signal from the AND gate 71c is outputted as the control signal EQSa, and outputted as the control signal $\overline{EQSa}$ via an inverter 72c. Referring to FIG. 11D, the global search line $\overline{GSL}$ is connected to a first input terminal of an AND gate 71d, and the control signal MEQS, to be described later in detail, from the memory controller 100 is outputted to a second terminal of the AND gate 71c. In addition, an output signal from the AND gate 71c is outputted as the control signal EQSb, and outputted as the control signal $\overline{EQSb}$ via an inverter 72d.

FIG. 12 is a timing chart showing an example of operation performed by the TCAM device of FIG. 10. Referring to FIG. 12, an interval from timings t10 to t13 indicates one cycle of a search operation performed by the TCAM device of FIG. 10. In this case, one cycle of the search operation includes a reset interval from timings t10 to t11, an equalization interval from timings t11 to t12, and a search interval from timings t12 to t13.

In a manner similar to that of the operation according to the first preferred embodiment (See FIG. 3), the memory controller 100 generates and outputs the control signals RST, $\overline{RST}$, $\overline{EQ}$, and EQ in the reset interval, the equalization interval, and the search interval. In response to this, an electric potential of the match line MLn according to the present preferred embodiment changes in a manner similar to that of the match line MLp according to the first preferred embodiment, and an electric potential of the match line MLp according to the present preferred embodiment changes in a manner similar to that of the match line MLn according to the first preferred embodiment.

Referring to FIG. 12, as indicated by a broken lines in the reset interval, when the global search line GSL has the low level in the search operation just before the timing t10, the search line $\overline{SLp}$ is set to the high level corresponding to the power source electric potential VDD, and the search line SLn is set to the low level corresponding to the ground electric potential GND at the timing t10. On the other hand, as indicated by solid lines in the reset interval of FIG. 12, when the global search line GSL has the high level in the search operation just before the timing t10, the search line $\overline{SLp}$ is set to the low level, and the search line SLn is set to the high level at the timing t10. At the timing t10, the memory controller 100 generates the control signal MEQS having the high level, and outputs the same signal to the second input terminal of the AND gate 71c and the second input terminal of the AND gate 71d. In addition, at the timing t10, the memory controller 100 generates the control signal MSE having the low level, and outputs the same signal to the second input terminal of the AND gate 71a and the second input terminal of the AND gate 71b.

When the global search line GSL has the low level at the timing t10, in response to the control signal MEQS having the high level, the AND gate 71c generates the control signal $\overline{EQSa}$ having the low level and outputs the same signal to the gate electrode of the N channel MOSFET 69a, and the inverter 72c generates the control signal EQSa having the low level and outputs the same signal to the gate electrode of the P channel MOSFET 68a. Further, in response to the control signal MSE having the low level, the AND gate 71a generates the control signal $\overline{SEa}$ having the low level and outputs the same signal to the gate electrodes of the P channel MOSFETs 62a and 66a, and the inverter 72a generates the control signal SEa having the high level and outputs the same signal to the gate electrodes of the N channel MOSFETs 63a and 67a. Accordingly, the global search line GSL is connected to the search lines $\overline{SLp}$ and SLn, and therefore, in the reset interval of FIG. 12, the search line $\overline{SLp}$ holds the high level and the search line SLn holds the low level as indicated by broken lines.

On the other hand, when the global search line GSL has the high level at the timing t10, in response to the control signal MEQS having the high level, the AND gate 71c generates the control signal EQSa having the high level and outputs the same signal to the gate electrode of the N channel MOSFET 69a, and the inverter 72c generates the control signal $\overline{EQSa}$ having the low level and outputs the same signal to the gate electrode of the P channel MOSFET 68a. Further, in response to the control signal MSE having the low level, the AND gate 71a generates the control signal $\overline{SEa}$ having the high level and outputs the same signal to the gate electrodes of the P channel MOSFETs 62a and 66a, and the inverter 72a generates the control signal SEa having the low level and outputs the same signal to the gate electrodes of the N channel MOSFETs 63a and 67a. Accordingly, the global search line GSL is cut off from the search lines $\overline{SLp}$ and SLn, and the low level search line $\overline{SLp}$ and the high level search line SLn are connected to each other, and therefore, in the reset interval of FIG. 12, the electric potentials of the search line $\overline{SLp}$ and the search line SLn become VDD/2 as indicated by solid lines. The operation for setting the electric potentials of the search lines $\overline{SLp}$ and SLn equal will be referred to as a search line equalization operation hereinafter.

For an interval from the timings t11 to t13 of FIG. 12, the memory controller 100 generates the control signal MEQS having the low level and outputs the same signal to the second input terminal of the AND gate 71c and the second input terminal of the AND gate 71d, and generates the control signal MSE having the high level and outputs the same signal to the second input terminal of the AND gate 71a and the second input terminal of the AND gate 71b. Further, at the timing t11, the memory controller 100 sets the paired global search lines $\overline{GSL}$ and GSL to the low level. In response to this, the AND gate 71c generates the control signal EQSa having the low level and outputs the same signal to the gate electrode of the N channel MOSFET 69a, and the inverter 72c generates the control signal $\overline{EQSa}$ having the high level and outputs the same signal to the gate electrode of the P channel MOSFET 678. Further, the AND gate 71a generates the control signal $\overline{SEa}$ having the low level and outputs the same signal to the gate electrodes of the P channel MOSFETs 62a and 66a, and the inverter 72a generates the control signal SEa having the high level and outputs the same signal to the gate electrodes of the N channel MOSFETs 63a and 67a. Accordingly, the search line $\overline{SLp}$ is set to the high level corresponding to the power source electric potential VDD, and the search line SLn is set to the low level corresponding to the ground electric potential GND.

At the timing t12, the memory controller 100 outputs search data to the paired global search lines $\overline{GSL}$ and GSL. In response to this, one of the paired global search lines $\overline{GSL}$ and GSL is set to the high level as shown in FIG. 12. In response to this, as indicated by the timings t12 to t13 of FIG. 12, the electric potentials of the search lines $\overline{SLp}$ and SLn change from the electric potentials in the equalization interval or hold the electric potentials in the equalization interval.

At the timing t13, the memory controller 100 generates the control signal MEQS having the high level again and outputs the same signal to the second input terminal of the AND gate 71c and the second input terminal of the AND gate 71d, and generates the control signal MSE having the low level and outputs the same signal to the second input terminal of the AND gate 71a and the second input terminal of the AND gate 71b, so as to perform a next search operation.

Referring to FIG. 12, it is necessary to set the search line $\overline{SLp}$ to the high level and the search line SLn to the low level before the search interval. According to the present preferred embodiment, when the search line $\overline{SLp}$ is set to the low level, the search line SLn is always set to the high level. On the other hand, when the search line $\overline{SLp}$ is set to the high level, the search line SLn is always set to the low level. When the search line $\overline{SLp}$ is set to the low level and the search line SLn is set to the high level at the timing t10, half of electric charges of the search line SLn are passed to the search line $\overline{SLp}$ by the above-stated search line equalization operation. Therefore, a quantity of the electric charges for charging and discharging of the search lines $\overline{SLp}$ and SLn are made half as compared with those of the prior art. On the other hand, when the search line $\overline{SLp}$ is set to the high level and the search line SLn is set to the low level at the timing t10, the TCAM device controls not to perform the search equalization operation. Accordingly, no electric charge loss occurs. Therefore, the present preferred embodiment exhibits such an advantageous effect that the power consumption and the peak current can be reduced to a three fourth of those for the prior art, respectively.

In the present preferred embodiment, the search line equalization operation is executed on the search lines $\overline{SLp}$ and SLn during the reset interval (from the timings t10 to t11 of FIG. 12) for the match lines MLp and MLn. However, the present invention is not limited to this. The search line equalization operation may be executed before the search interval such as during the equalization interval of FIG. 12.

Fifth Preferred Embodiment

Figure 13:
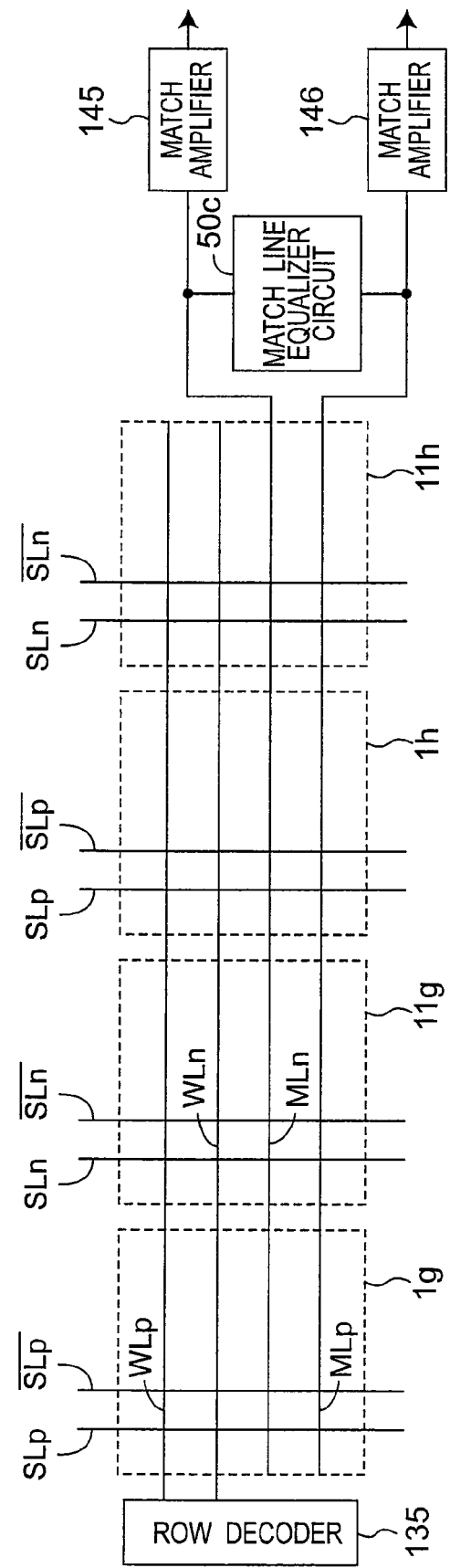
FIG. 13 is a block diagram showing a configuration of a TCAM device of a content addressable memory device according to a fifth preferred embodiment of the present invention.

FIG. 13 is a block diagram showing a configuration of a TCAM device of a content addressable memory device according to a fifth preferred embodiment of the present invention. The TCAM device of FIG. 13 is a TCAM device of a mat having a stripe arranged configuration. Referring to FIG. 13, a PCAM cell 1g, an NCAM cell 11g, a PCAM cell 1h, and an NCAM cell 11h are arranged in a bit direction in this order. In this case, each of the PCAM cells 1g and 1h has a configuration similar to that of the PCAM cell 1 of FIG. 2, and each of the NCAM cells 11g and 11h has a configuration similar to that of the NCAM cell 11 of FIG. 2. A word line WLp provided so as to be common to the PCAM cells 1g and 1h and a word line WLn provided so as to be common to the NCAM cells 11g and 11h are connected to a row decoder 135. In addition, a match line MLp provided so as to be common to the PCAM cells 1g and 1h and a match line MLn provided so as to be common to the NCAM cells 11g and 11h are connected to match amplifiers 145 and 146, respectively, and connected to a match line equalizer circuit 50c. The match line equalizer circuit 50c has a configuration similar to that of the match line equalizer circuit 50 of FIG. 2. The row decoder 135 and the match line equalizer circuit 50c are arranged on both sides of an array of the PCAM cells 1g, the NCAM cells 11g, the PCAM cells 1h, and the NCAM cells 11h, respectively.

FIG. 13 shows an example of the mat having two pairs of the NCAM cell and PCAM cell arranged thereon, however, one or three or more pairs, i.e., a plurality of pairs of the NCAM cell and PCAM cells may be arranged into stripes. In particular, when two or more pairs of the NCAM cells and PCAM cells are arranged into strips, it is possible to realize a partial search for every pair of the NCAM cell and PCAM cell, a hierarchical search, and a pipeline search. Accordingly, it is possible to further reduce the power consumption and the peak current as compared with those of the TCAM device according to the first preferred embodiment.

Sixth Preferred Embodiment

Figure 14:
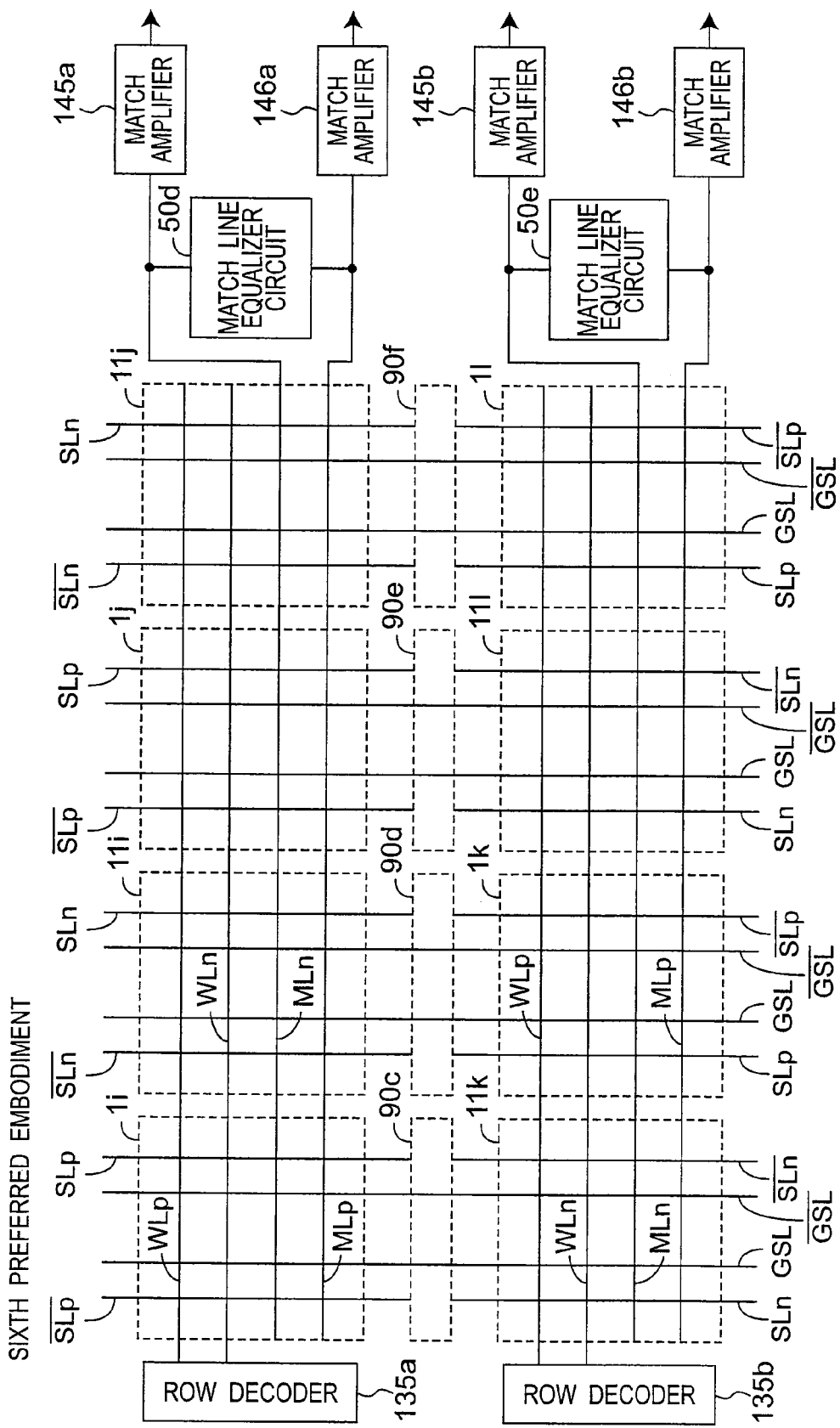
FIG. 14 is a block diagram showing a configuration of a TCAM device of a content addressable memory device according to a sixth preferred embodiment of the present invention.

FIG. 14 is a block diagram showing a configuration of a TCAM device of a content addressable memory device according to a sixth preferred embodiment of the present invention. As shown in FIG. 14, PCAM cells 1$i$, 1$j$, 1$k$ and 1$l$, and NCAM cells 11$i$, 11$j$, 11$k$ and 11$l$ are arranged into a checkerboard pattern. In this case, each of the PCAM cells 1$i$, 1$j$, 1$k$ and 1$l$ has a configuration similar to that of the PCAM cell 1 of FIG. 2, and each of the NCAM cells 11$i$, 11$j$, 11$k$ and 11$l$ has a configuration similar to that of the NCAM cell 11 of FIG. 2.

Referring to FIG. 14, a word line WLp provided so as to be common to the PCAM cells 1$i$ and 1$j$, and a word line WLn provided so as to be common to the NCAM cells 11$i$ and 11$j$ are connected to a row decoder 135$a$. In addition, a match line MLp provided so as to be common to the PCAM cells 1$i$ and 1$j$, and a match line MLn provided so as to be common to the NCAM cells 11$i$ and 11$j$ are connected to match amplifiers 145$a$ and 146$a$, respectively, and connected to a match line equalizer circuit 50$d$. The match line equalizer circuit 50$d$ has a configuration similar to that of the match line equalizer circuit 50 of FIG. 2. The row decoder 135$a$ and the match line equalizer circuit 50$d$ are arranged on both sides of an array of the PCAM cells 1$i$, the NCAM cells 11$i$, the PCAM cells 1$j$, and the NCAM cells 11$j$, respectively.

In addition, referring to FIG. 14, a word line WLp provided so as to be common to the PCAM cells 1$k$ and 1$l$, and a word line WLn provided so as to be common to the NCAM cells 11$k$ and 11$l$ are connected to a row decoder 135$b$. Further, a match line MLp provided so as to be common to the PCAM cells 1$k$ and 1$l$, and a match line MLn provided so as to be common to the NCAM cells 11$k$ and 11$l$ are connected to match amplifiers 145$b$ and 146$b$, respectively, and connected to a match line equalizer circuit 50$e$. The match line equalizer circuit 50$e$ has a configuration similar to that of the match line equalizer circuit 50 of FIG. 2. The row decoder 135$b$ and the match line equalizer circuit 50$e$ are arranged on both sides of an array of the NCAM cells 11$k$, the PCAM cells 1$k$, the NCAM cells 11$l$, and the PCAM cells 1$l$, respectively.

Further, referring to FIG. 14, a search line equalizer circuit 90$c$ is arranged between the PCAM cells 1$i$ and the NCAM cells 11$k$, a search line equalizer circuit 90$d$ is arranged between the NCAM cells 11$i$ and the PCAM cells 1$k$, a search line equalizer circuit 90$e$ is arranged between the PCAM cells 1$j$ and the NCAM cells 11$l$, and a search line equalizer circuit 90$f$ is arranged between the NCAM cells 11$j$ and the PCAM cells 11. In this case, each of the search line equalizer circuits 90$c$, 90$d$, 90$e$, and 90$f$ has a configuration similar to that of the search line equalizer circuit 90$a$ of FIG. 10.

According to the present preferred embodiment, it is possible to realize the partial search, the hierarchical search, and the pipeline search more easily as compared with the fifth preferred embodiment. In addition, it is possible to implement a hierarchical word line configuration, an arrangement of each charge recycling CAM precharge circuit, and an arrangement of a search line precharge circuit for precharging the search lines either solely or in combination. Further, it is possible to wire the wirings of the power sources and the ground lines for array configuration relatively easily, and it is possible to reduce an impedance of the power source line.

The TCAM device according to each of the above-stated preferred embodiments is constructed by including TCAMs, however, the present invention is not limited to this, and a TCAM device may be constructed by including CAMs.

As stated so far in detail, there is provided a content addressable memory device including a first memory cell and a second memory cell. The content addressable memory device is characterized by further including a match line equalizer circuit and a controller. In this case, the first memory cell is connected to a first match line and a first search line, and has a first storage element and a first comparator circuit. The first storage element stores first data, and the first comparator circuit compares first search data inputted via the first search line with the first data, generates a first signal indicating a result of the comparison, and outputs the first signal to the first match line. The second memory cell is connected to a second match line and a second search line, and has a second storage element and a second comparator circuit. The second storage element stores second data, and the second comparator circuit compares second search data inputted via the second search line with the second data, generates a second signal indicating a result of the comparison, and outputs the second signal to the second match line. The match line equalizer circuit has a first switch connected between the first match line and a power source, a second switch connected between the second match line and a ground, and a third switch connected between the first and second match lines. Before the comparisons by the first and second comparator circuits, the controller controls the first and second switches to be turned on and the third switch to be turned off, and then controls the first and second switches to be turned off and the third switch to be turned on, so that electric potentials of the first and second match lines are the same as each other.

Concretely speaking, the first match line is the match line MLp, and the second match line is the match line MLn. The match line MLp is connected to the power source having the power source electric potential VDD and the match line MLn is grounded, and then the match line MLp is connected to the match line MLn so that electric potentials of the match lines MLp and MLn are the same as each other and each of the electric potentials has an electric potential of VDD/2. Accordingly, the present invention has an advantageous effect that the power consumption and the peak current can be reduced to a quarter of those of the prior art, respectively.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A content addressable memory device comprising:
a first memory cell connected to a first match line and a first search line and having a first storage element and a first comparator circuit, the first storage element storing first data, the first comparator circuit comparing first search data inputted via the first search line with the first data, generating a first signal indicating a result of the comparison, and outputting the first signal to the first match line; and
a second memory cell connected to a second match line and a second search line and having a second storage element and a second comparator circuit, the second storage element storing second data, the second comparator circuit comparing second search data inputted via the second search line with the second data, generating a second signal indicating a result of the comparison, and outputting the second signal to the second match line, wherein the content addressable memory device further comprises:

a match line equalizer circuit having a first switch connected between the first match line and a power source, a second switch connected between the second match line and a ground, and a third switch connected between the first and second match lines; and a controller for, before the comparisons by the first and second comparator circuits, controlling the first and second switches to be turned on and the third switch to be turned off, and then controlling the first and second switches to be turned off and the third switch to be turned on, so that electric potentials of the first and second match lines are the same as each other.

2. The content addressable memory device as claimed in claim 1, wherein one of the first and second memory cells is formed in a P channel memory region of the content addressable memory device, and another one of the first and second memory cells is formed in an N channel memory region of the content addressable memory device.

3. The content addressable memory device as claimed in claim 1, wherein the first and second memory cells are formed in P channel memory regions of the content addressable memory device, respectively.

4. The content addressable memory device as claimed in claim 1, wherein the first and second memory cells are formed in N channel memory regions of the content addressable memory device, respectively.

5. The content addressable memory device as claimed in claim 1, further comprising:

a third memory cell connected to a third match line and a third search line and having a third storage element and a third comparator circuit, the third storage element storing third data, the third comparator circuit comparing third search data inputted via the third search line with the third data, generating a third signal indicating a result of the comparison, and outputting the third signal to the third match line; and a search line equalizer circuit connected between the first and third search lines, wherein the controller controls the search line equalizer circuit to make electric potentials of the first and third search lines to be the same as each other before the comparisons by the first and third comparator circuits.

6. The content addressable memory device as claimed in claim 1, wherein, when the electric potentials of the first and second match lines are made to be the same as each other by the controller, each of the electric potentials of the first and second match lines is an electric potential substantially a half of a sum of a voltage of the power source and a voltage of the ground.

7. A content addressable memory device comprising:

a first memory cell connected to a first match line and a first search line and having a first storage element and a first comparator circuit, the first storage element storing first data, the first comparator circuit comparing first search data inputted via the first search line with the first data, generating a first signal indicating a result of the comparison, and outputting the first signal to the first match line; and a second memory cell connected to a second match line and a second search line and having a second storage element and a second comparator circuit, the second storage element storing second data, the second comparator circuit comparing second search data inputted via the second search line with the second data, generating a second signal indicating a result of the comparison, and outputting the second signal to the second match line;

wherein the content addressable memory device further comprises:

a search line equalizer circuit connected between the first and second search lines; and a controller for controlling the search line equalizer circuit to make electric potentials of the first and second search lines to be the same as each other before the comparisons by the first and second comparator circuits.

8. The content addressable memory device as claimed in claim 7, wherein one of the first and second memory cells is formed in a P channel memory region of the content addressable memory device, and another one of the first and second memory cells is formed in an N channel memory region of the content addressable memory device.

* * * * *